(12) United States Patent
Kim et al.

(10) Patent No.: US 11,881,487 B2
(45) Date of Patent: Jan. 23, 2024

(54) TRANSISTOR SUBSTRATE AND DISPLAY DEVICE INCLUDING THE SAME

(71) Applicant: Samsung Display Co., LTD., Yongin-si (KR)

(72) Inventors: Han Bit Kim, Seoul (KR); Mee Jae Kang, Suwon-si (KR); Keun Woo Kim, Seongnam-si (KR); Doo-Na Kim, Seongnam-si (KR); Sang Sub Kim, Suwon-si (KR); Do Kyeong Lee, Yongin-si (KR); Jae Hwan Chu, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 247 days.

(21) Appl. No.: 17/386,854

(22) Filed: Jul. 28, 2021

(65) Prior Publication Data
US 2022/0139966 A1 May 5, 2022

(30) Foreign Application Priority Data

Nov. 2, 2020 (KR) .......................... 10-2020-0144661

(51) Int. Cl.
*H01L 27/12* (2006.01)
*H01L 27/15* (2006.01)
*H10K 59/121* (2023.01)

(52) U.S. Cl.
CPC ........ *H01L 27/1222* (2013.01); *H01L 27/124* (2013.01); *H01L 27/156* (2013.01); *H10K 59/1213* (2023.02)

(58) Field of Classification Search
CPC . H01L 27/1222; H01L 27/124; H01L 27/156; H10K 59/1213
(Continued)

(56) References Cited

U.S. PATENT DOCUMENTS

| 2016/0116776 | A1* | 4/2016 | Hayashi | ............ H01L 29/78633 349/43 |
| 2016/0204172 | A1* | 7/2016 | Park | ..................... H10K 59/124 257/40 |
| 2021/0366941 | A1* | 11/2021 | Diao | ................... H01L 27/1274 |

FOREIGN PATENT DOCUMENTS

| JP | 2015232603 | 12/2015 |
| KR | 100219504 | 9/1999 |

(Continued)

*Primary Examiner* — Charles S Chang
(74) *Attorney, Agent, or Firm* — CANTOR COLBURN LLP

(57) ABSTRACT

A display device includes a substrate, a semiconductor layer disposed on the substrate, and including a first channel portion, a second channel portion, a connecting portion disposed between the first channel portion and the second channel portion, and electrode regions, a first insulating layer disposed on the semiconductor layer, a gate conductor disposed on the first insulating layer and including a first gate electrode overlapping the first channel portion and a second gate electrode overlapping the second channel portion, signal lines disposed on the substrate, a first electrode electrically connected to at least one of electrode regions of the semiconductor layer, an emission layer disposed on the first electrode, and a second electrode disposed on the emission layer, and the first channel portion and the second channel portion of the semiconductor layer each have a first width greater than a second width of the connecting portion.

19 Claims, 18 Drawing Sheets

(58) Field of Classification Search
USPC .................................................. 349/42–46
See application file for complete search history.

(56) References Cited

FOREIGN PATENT DOCUMENTS

| KR | 100476926 | 3/2005 |
|----|-----------|--------|
| KR | 100638085 | 10/2006 |
| KR | 1020150017192 | 2/2015 |
| KR | 1020160098650 | 8/2016 |

* cited by examiner

TRANSISTOR SUBSTRATE AND DISPLAY DEVICE INCLUDING THE SAME

This application claims priority to Korean Patent Application No. 10-2020-0144661, filed on Nov. 2, 2020, and all the benefits accruing therefrom under 35 U.S.C. § 119, the content of which in its entirety is herein incorporated by reference.

BACKGROUND

1. Field

Embodiments of the invention relate to a transistor substrate and a display device including the same.

2. Description of the Related Art

An emissive display device has a self-emitting characteristic, so an additional light source is not desired, differing from a liquid crystal display device, thereby reducing a thickness and a weight thereof. Further, the light emitting diode display has high-quality characteristics such as low power consumption, high luminance, and high reaction speeds.

The emissive display device includes a light emitting diode ("LED") including two electrodes and an emission layer disposed therebetween, and when holes and electrons are injected into the emission layer from the two electrodes, excitons that are a combination of the injected holes and electrons fall to a ground state from an excited state and emit light.

The emissive display device includes a plurality of pixels which respectively include an organic light emitting diode and a pixel circuit for driving the organic light emitting diode. The pixel circuit may include a plurality of transistors and at least one capacitor.

SUMMARY

As a resolution of an emissive display device increases, it is driven with high luminance and at a high temperature, and in this instance, drawbacks such as a leakage current, afterimages, or reliability deterioration may be generated. A threshold voltage is shifted by parasitic capacitance at a transistor to increase the leakage current, for example, and luminance may accordingly be deteriorated. The deterioration of luminance deteriorates displaying quality.

The described technology has been made in an effort to provide a transistor substrate for preventing deterioration of displaying quality according to parasitic capacitance of a transistor by reducing the parasitic capacitance of a transistor, and a display device including the same.

The feature of the invention is not limited to the above-described feature, and it may be expanded in various ways in the range of the ideas and the areas of the invention.

An embodiment provides a transistor substrate including a substrate, a semiconductor layer disposed on the substrate, and including a first channel portion, a second channel portion, and a connecting portion disposed between the first channel portion and the second channel portion, a first insulating layer disposed on the semiconductor layer, and a gate conductor disposed on the first insulating layer, and including a first gate electrode overlapping the first channel portion and a second gate electrode overlapping the second channel portion, where the first channel portion and the second channel portion of the semiconductor layer each have a first width in directions respectively perpendicular to main extension directions of the first and second channel portions, and the first width is greater than a second width of the connecting portion in a direction perpendicular to a main extension direction of the connecting portion.

In an embodiment, the transistor substrate may further include a second insulating layer disposed on the gate conductor, and a signal line disposed on the second insulating layer, where the connecting portion may overlap the signal line with the second insulating layer therebetween.

In an embodiment, the connecting portion may further include a first connecting portion extending in a first direction and two second connecting portions extending in a second direction that is different from the first direction, the semiconductor layer may further include a first inclined portion disposed between the first channel portion and the connecting portion and a second inclined portion disposed between the second channel portion and the connecting portion, and edges of the first inclined portion and the second inclined portion may be inclined with a predetermined angle with respect to the first direction and the second direction.

In an embodiment, the connecting portion may further include a first connecting portion extending in a first direction and two second connecting portions extending in a second direction that is different from the first direction disposed on respective sides of the first connecting portion, the semiconductor layer may further include a first inclined portion disposed between the first channel portion and the connecting portion and a second inclined portion disposed between the second channel portion and the connecting portion, and edges of the first inclined portion and the second inclined portion may be inclined with a predetermined angle with respect to the first direction and the second direction.

Another embodiment provides a display device including a substrate, a semiconductor layer disposed on the substrate, and including a first channel portion, a second channel portion, a connecting portion disposed between the first channel portion and the second channel portion, and a plurality of electrode regions, a first insulating layer disposed on the semiconductor layer, a gate conductor disposed on the first insulating layer and including a first gate electrode overlapping the first channel portion and a second gate electrode overlapping the second channel portion, a plurality of signal lines disposed on the substrate, a first electrode electrically connected to at least one of the plurality of electrode regions of the semiconductor layer, an emission layer disposed on the first electrode, and a second electrode disposed on the emission layer, where the first channel portion and the second channel portion of the semiconductor layer each have a first width in directions respectively perpendicular to main extension directions of the first and second channel portions, and the first width is greater than a second width of the connecting portion in a direction perpendicular to a main extension direction of the connecting portion.

In an embodiment, the connecting portion may overlap one of the plurality of signal lines.

In an embodiment, the plurality of signal lines may include an initialization voltage line, and the connecting portion may overlap the initialization voltage line.

Another embodiment provides a display device including a substrate, a plurality of signal lines including an initialization voltage line, a plurality of scan lines, a control line, a storage line, a data line, and a driving voltage line disposed on the substrate, a plurality of transistors connected to the signal lines, a first electrode connected to one of the transistors, an emission layer disposed on the first electrode, and a second electrode disposed on the emission layer, where the transistors includes a first transistor connected to a first scan line from among a plurality of scan lines, the storage line, and the first electrode. The first transistor includes a semiconductor layer disposed on the substrate, and including a first channel portion, a second channel portion, a connecting portion disposed between the first channel portion and the second channel portion, and a plurality of electrode regions, a first insulating layer disposed on the semiconductor layer, and a gate conductor disposed on the first insulating layer, and including a first gate electrode overlapping the first channel portion and a second gate electrode overlapping the second channel portion. The first channel portion and the second channel portion of the semiconductor layer each have a first width in directions respectively perpendicular to main extension directions of the first and second channel portions, and the first width is greater than a second width of the connecting portion in a direction perpendicular to a main extension direction of the connecting portion.

In an embodiment, the plurality of transistors may further include a second transistor connected to a second scan line from among the plurality of scan lines, the initialization voltage line, and the storage line. The second transistor may include the semiconductor layer disposed on the substrate, and including a third channel portion, a fourth channel portion, a first connecting portion disposed between the third channel portion and the fourth channel portion, and the plurality of electrode regions. The first insulating layer may be disposed on the semiconductor layer, and the gate conductor may be disposed on the first insulating layer and include a third gate electrode overlapping the third channel portion and a fourth gate electrode overlapping the fourth channel portion, and the third channel portion and the fourth channel portion of the semiconductor layer may each have a third width in directions respectively perpendicular to main extension directions of the third and fourth channel portions, and the third width may be greater than a fourth width of the first connecting portion in a direction perpendicular to a main extension direction of the first connecting portion.

According to the display device in the embodiments, deterioration of displaying quality according to the parasitic capacitance of the transistor may be prevented by reducing the parasitic capacitance of the transistor.

The feature of the invention is not limited to the above-described feature, and it may be expanded in various ways in the range of the ideas and the areas of the invention.

BRIEF DESCRIPTION OF THE DRAWINGS

The above and other embodiments, advantages and features of this disclosure will become more apparent by describing in further detail embodiments thereof with reference to the accompanying drawings.

DETAILED DESCRIPTION

Figure 1:
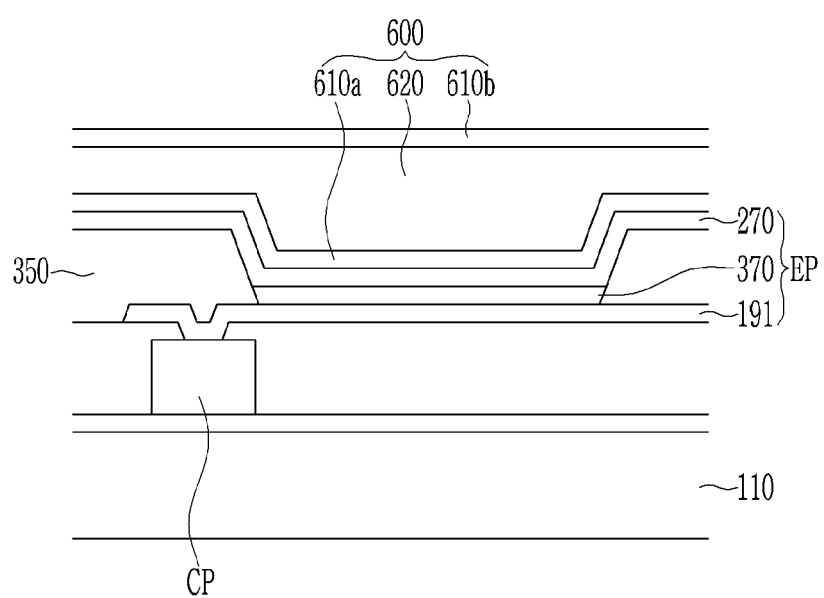
FIG. 1 shows a cross-sectional view of an embodiment of a display device.

Embodiments of the invention will be described more fully hereinafter with reference to the accompanying drawings, in which embodiments of the invention are shown. As those skilled in the art would realize, the described embodiments may be modified in various different ways, all without departing from the spirit or scope of the invention.

Parts that are irrelevant to the description will be omitted to clearly describe the invention, and the same elements will be designated by the same reference numerals throughout the specification.

The size and thickness of each configuration shown in the drawings are arbitrarily shown for better understanding and ease of description, but the invention is not limited thereto. In the drawings, the thickness of layers, films, panels, regions, etc., are exaggerated for clarity. The thicknesses of some layers and areas are exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means disposed on or below the object portion, and does not necessarily mean disposed on the upper side of the object portion based on a gravitational direction.

Unless explicitly described to the contrary, the word "comprise", and variations such as "comprises" or "comprising", will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

When it is described that a part is "connected (in contact with, coupled)" to another part, the part may be "directly connected" to the other element, may be "connected" to the other part through a third part, or may be connected to the other part physically or electrically, and they may be referred to by different titles depending on positions or functions, but they may be substantially integrated into one body.

A schematic structure of a display device in an embodiment will now be described with reference to FIG. 1. FIG. 1 shows a cross-sectional view of an embodiment of a display device.

Referring to FIG. 1, the display device includes a pixel circuit portion CP disposed on a substrate 110, and an emission portion EP connected to the pixel circuit portion CP. The emission portion EP may include a pixel electrode 191 connected to the pixel circuit portion CP, an emission layer 370 disposed on the pixel electrode 191, and a common electrode 270 disposed on the emission layer 370.

The emission layer 370 may be disposed in a region defined by a partition wall 350 overlapping the pixel electrode 191, and the common electrode 270 may be disposed on the emission layer 370 and the partition wall 350 and may be disposed on a plurality of pixel areas.

A thin film encapsulation layer 600 covering the substrate 110 may be disposed on the substrate 110 on which the pixel circuit portion CP and the emission portion EP are disposed. The thin film encapsulation layer 600 may include a first layer 610a and a second layer 610b including an inorganic material, and a third layer 620 including an organic material and disposed between the first layer 610a and the second layer 610b. The thin film encapsulation layer 600 may seal the substrate 110.

Figure 2:
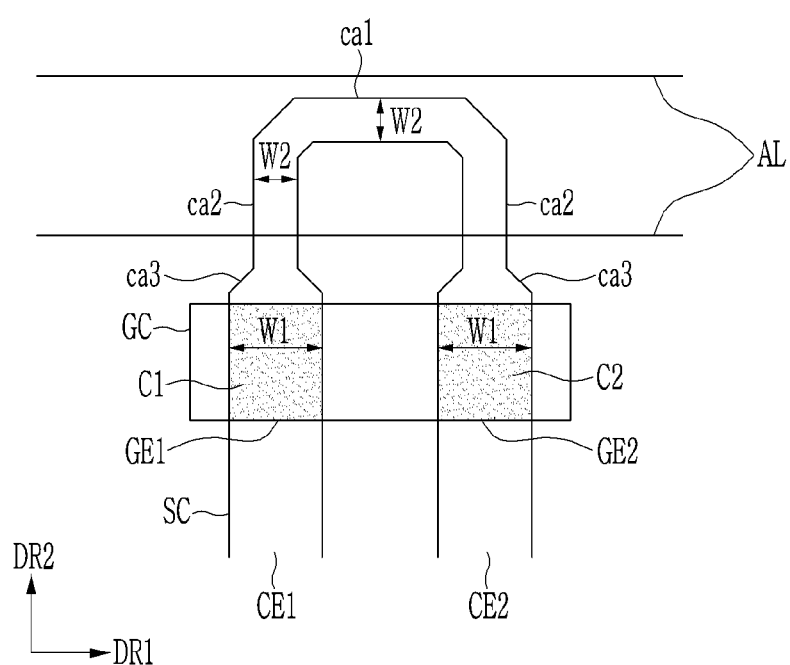
FIG. 2 shows a top plan view of part of an embodiment of a display device.

A predetermined region included in the pixel circuit portion CP of the display device in an embodiment will now be described with reference to FIG. 2. FIG. 2 shows a top plan view of part of an embodiment of a display device.

Referring to FIG. 2, the pixel circuit portion of the display device may include a semiconductor layer SC, and a gate conductor GC overlapping a portion of the semiconductor layer SC.

The semiconductor layer SC includes a first channel portion C1 and a second channel portion C2 overlapping the gate conductor GC.

The first channel portion C1 and the second channel portion C2 may be unitary with each other by a first connecting portion ca1, a second connecting portion ca2, and inclined portions ca3. The first connecting portion ca1 may extend in a first direction DR1, and the two second connecting portions ca2 may extend in a second direction DR2 and may be disposed between the first connecting portion ca1 and the first channel portion C1 and between the first connecting portion ca1 and the second channel portion C2. Each inclined portions ca3 may be disposed between the second connecting portion ca2 and the first channel portion C1 and between the second connecting portion ca2 and the second channel portion C2.

The first channel portion C1 and the second channel portion C2 have a first width W1, the first connecting portion ca1 and the second connecting portion ca2 have a second width W2, and the second width W2 is less than the first width W1. The inclined portions ca3 are disposed between the first channel portion C1 with a first width W1 and the second connecting portion ca2 with a second width W2 and between the second channel portion C2 with a first width W1 and the second connecting portion ca2 with a second width W2, and a width of the semiconductor layer SC reduces as a portion of the semiconductor layer SC is closer to the two second connecting portions ca2 from the first channel portion C1 and the second channel portion C2.

The semiconductor layer SC includes a first region CE1 and a second region CE2 disposed on one sides of the first channel portion C1 and the second channel portion C2.

The first region CE1 and the second region CE2 of the semiconductor layer SC have a higher carrier concentration than those of the first channel portion C1 and the second channel portion C2. Similarly, the first connecting portion ca1, the second connecting portion ca2, and the inclined portions ca3 of the semiconductor layer SC may have a higher carrier concentration than those of the first channel portion C1 and the second channel portion C2. In an embodiment, the first region CE1 and the second region CE2 of the semiconductor layer SC and the first connecting portion ca1, the second connecting portion ca2, and the inclined portions ca3 of the semiconductor layer SC may be conductive regions, for example.

The gate conductor GC includes a first gate electrode GE1 overlapping the first channel portion C1 of the semiconductor layer SC and a second gate electrode GE2 overlapping the second channel portion C2.

The first channel portion C1, the second channel portion C2, the first gate electrode GE1, the second gate electrode GE2, the first region CE1, and the second region CE2 may configure a transistor, and the transistor may have a dual gate structure including two gate electrodes GE1 and GE2.

The circuit portion of the display device may include an additional line AL depending on designs, the additional line AL may receive a predetermined voltage, and a size of the voltage applied to the additional line AL is variable. The additional line AL may overlap the first connecting portion ca1 and the second connecting portion ca2 of the semiconductor layer SC with an insulating layer therebetween. The additional line AL may extend in parallel to the first direction DR1.

As described above, parasitic capacitance is generated by the overlapping of the additional line AL and the first connecting portion ca1 and the second connecting portion ca2, and voltages at the first gate electrode GE1 and the second gate electrode GE2 may be changed by the parasitic capacitance. Particularly, when the size of the voltage applied to the additional line AL is not constant but is changeable, the parasitic capacitance caused by the overlapping of the additional line AL and the first connecting portion ca1 and the second connecting portion ca2 is changed, and the voltages at the first gate electrode GE1 and the second gate electrode GE2 may not be constant but may be variable.

As described above, according to the display device in an embodiment, the first channel portion C1 and the second channel portion C2 have a first width W1, the first connecting portion ca1 and the second connecting portion ca2 have a second width W2, and the second width W2 is less than the first width W1. Therefore, when the additional line AL overlaps the first connecting portion ca1 and the second connecting portion ca2 of the semiconductor layer SC, the overlapping area may be relatively narrow. When the second width W2 of the first connecting portion ca1 and the second connecting portion ca2 is equal to or greater than the first width W1 of the first channel portion C1 and the second channel portion C2, the overlapping area that overlaps the additional line AL may increase compared to the case in which the second width W2 of the first connecting portion ca1 and the second connecting portion ca2 is less than the first width W1 of the first channel portion C1 and the second channel portion C2.

As described above, as the second width W2 of the first connecting portion ca1 and the second connecting portion ca2 is less than the first width W1 of the first channel portion C1 and the second channel portion C2, the area in which the additional line AL overlaps the first connecting portion ca1 and the second connecting portion ca2 may be reduced without reducing the width of the first channel portion C1 and the second channel portion C2.

Therefore, the change of voltages at the first gate electrode GE1 and the second gate electrode GE2 by the parasitic capacitance may be reduced without reducing a width of the channel of the transistor.

Figure 3:
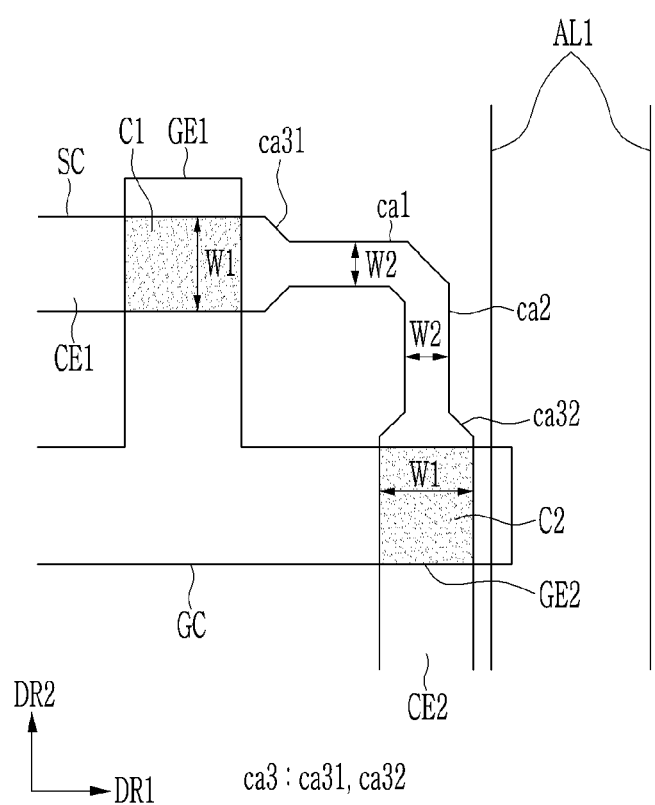
FIG. 3 shows a top plan view of part of an embodiment of a display device.

A predetermined region included in the pixel circuit portion of the display device in an embodiment will now be described with reference to FIG. 3. FIG. 3 shows a top plan view of part of an embodiment of a display device.

Referring to FIG. 3, the display device is similar to some of the display device described with reference to FIG. 2.

The pixel circuit portion of the display device may include a semiconductor layer SC, and a gate conductor GC overlapping a predetermined portion of the semiconductor layer SC.

The semiconductor layer SC includes a first channel portion C1 and a second channel portion C2 overlapping the gate conductor GC.

The first channel portion C1 may be unitary with the second channel portion C2 by the first connecting portion ca1, the second connecting portion ca2, and the inclined portions ca3. The first connecting portion ca1 extends in the first direction DR1, and the second connecting portion ca2 extends in the second direction DR2. Two inclined portions ca31 and ca32 may be disposed between the first connecting portion ca1 and the first channel portion C1 and between the second connecting portion ca2 and the second channel portion C2.

The first channel portion C1 and the second channel portion C2 have a first width W1, the first connecting portion ca1 and the second connecting portion ca2 have a second width W2, and the second width W2 is less than the first width W1. The inclined portions ca3 are disposed between the first channel portion C1 with a first width W1 and the first connecting portion ca1 with a second width W2 and between the second channel portion C2 with a first width W1 and the second connecting portion ca2 with a second width W2, and the width of the semiconductor layer SC reduces as the direction goes toward the first connecting portion ca1 and the second connecting portion ca2 from the first channel portion C1 and the second channel portion C2.

The semiconductor layer SC includes a first region CE1 and a second region CE2 disposed on one side of each of the first channel portion C1 and the second channel portion C2.

The first region CE1 and the second region CE2 of the semiconductor layer SC have a higher carrier concentration than those of the first channel portion C1 and the second channel portion C2. Similarly, the first connecting portion ca1, the second connecting portion ca2, and the inclined portions ca3 of the semiconductor layer SC may have a higher carrier concentration than those of the first channel portion C1 and the second channel portion C2. In an embodiment, the first region CE1 and the second region CE2 of the semiconductor layer SC and the first connecting portion ca1, the second connecting portion ca2, and the inclined portions ca3 of the semiconductor layer SC may be conductive regions, for example.

The gate conductor GC includes a first gate electrode GE1 overlapping the first channel portion C1 of the semiconductor layer SC and a second gate electrode GE2 overlapping the second channel portion C2.

The first channel portion C1, the second channel portion C2, the first gate electrode GE1, the second gate electrode GE2, the first region CE1, and the second region CE2 may configure a transistor, and the transistor may have a dual gate structure including two gate electrodes GE1 and GE2.

The circuit portion of the display device may include an additional line AL1 depending on designs, the additional line AL1 may receive a predetermined voltage, and a size of the voltage applied to the additional line AL1 is variable. The additional line AL1 may be disposed to be adjacent to the first connecting portion ca1 and the second connecting portion ca2 of the semiconductor layer SC and may extend in parallel to the second direction DR2.

As described above, the additional line AL1 may be disposed near the first connecting portion ca1 and the second connecting portion ca2 to cause parasitic capacitance between the additional line AL1 and the first connecting portion ca1 and second connecting portion ca2, and the voltages at the first gate electrode GE1 and the second gate electrode GE2 may be changed by the parasitic capacitance. Particularly, when the size of the voltage applied to the additional line AL1 is not constant but is changed, the parasitic capacitance caused by the overlapping among the additional line AL1, first connecting portion ca1, and the second connecting portion ca2 is changed, and the voltages at the first gate electrode GE1 and the second gate electrode GE2 may not be constant but may be changed.

As described above, according to the display device in an embodiment, the first channel portion C1 and the second channel portion C2 have a first width W1, the first connecting portion ca1 and the second connecting portion ca2 have a second width W2, and the second width W2 is less than the first width W1. As the second width W2 of the first connecting portion ca1 and the second connecting portion ca2 is less than the first width W1 of the first channel portion C1 and the second channel portion C2, the area in which the additional line AL overlaps the first connecting portion ca1 and the second connecting portion ca2 may be reduced without reducing the width of the first channel portion C1 and the second channel portion C2.

Therefore, the changes of the voltage of the first gate electrode GE1 and the second gate electrode GE2 caused by the parasitic capacitance may be prevented without reducing the channel width of the transistor.

Figure 4:
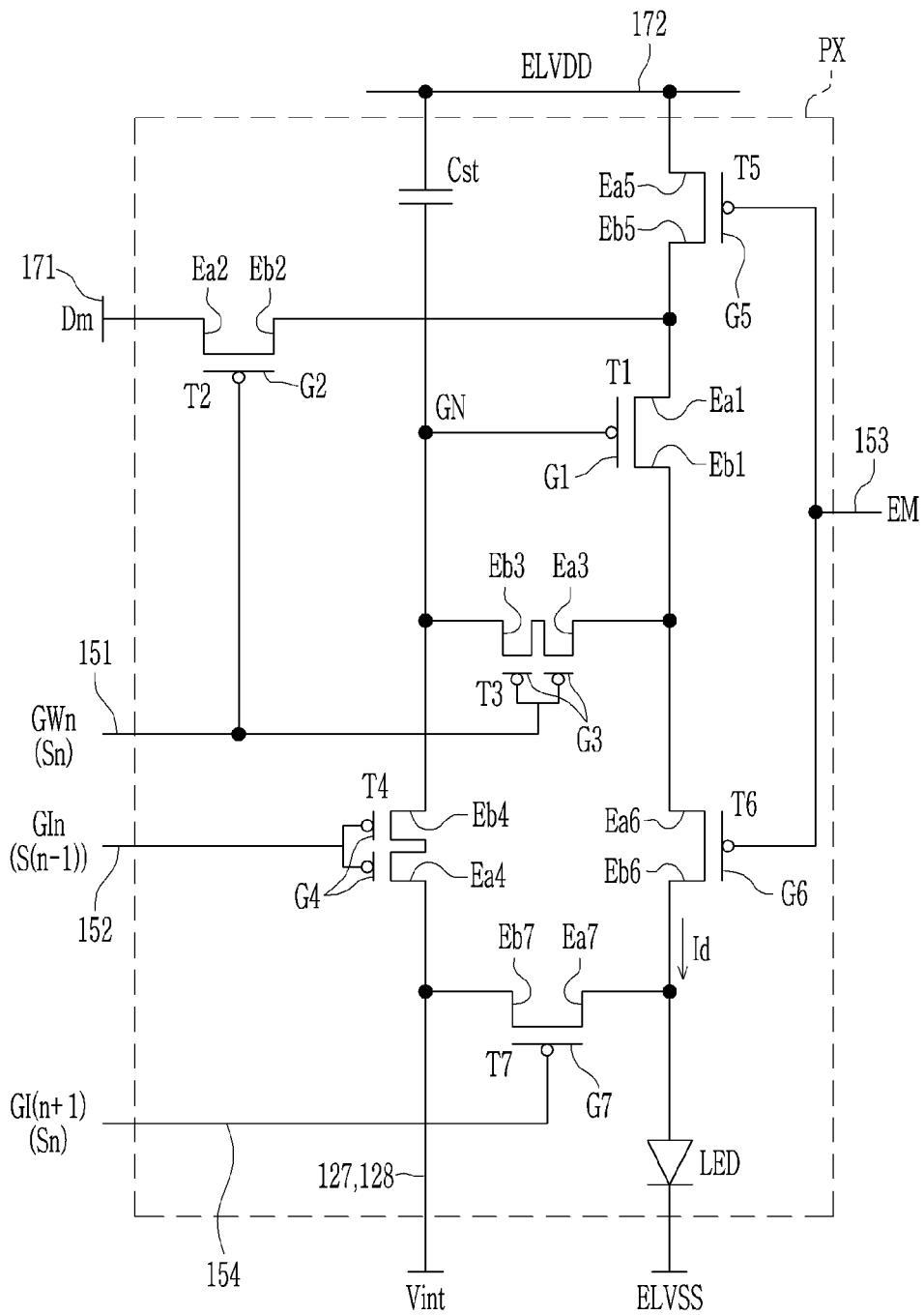
FIG. 4 shows a circuit diagram of an embodiment of a pixel of a display device.

One pixel of a display device in an embodiment will now be described with reference to FIG. 4. FIG. 4 shows a circuit diagram of an embodiment of a pixel of a display device. For reference, one pixel may include a driving circuit portion and a light emitting diode connected to the driving circuit portion, and the driving circuit portion may include a plurality of transistors including a semiconductor layer and a conductor.

Referring to FIG. 4, the display device in an embodiment includes a plurality of pixels PX for displaying images and a plurality of signal lines 127, 151, 152, 153, 154, 171, and 172. One pixel PX may include a plurality of transistors T1, T2, T3, T4, T5, T6, and T7 connected to a plurality of signal lines 127, 151, 152, 153, 154, 171, and 172, a capacitor Cst, and at least one light emitting diode LED. In the illustrated embodiment, an example in which one pixel PX includes one light emitting diode LED will be mainly described.

The signal lines 127, 151, 152, 153, 154, 171, and 172 may include an initialization voltage line 127, a plurality of scan lines 151, 152, and 154, a control line 153, a data line 171, and a driving voltage line 172.

The initialization voltage line 127 may transmit an initialization voltage Vint. A plurality of scan lines 151, 152, and 154 may respectively transmit signals GWn, GIn, and GI(n+1). The scan signals GWn, GIn, and GI(n+1) may transmit a gate-on voltage and a gate-off voltage for turning on/off the transistors T2, T3, T4, and T7 included in the pixel PX.

The scan lines 151, 152, and 154 connected to one pixel PX may include a first scan line 151 for transmitting a scan signal GWn, a second scan line 152 for transmitting a scan signal GIn with a gate-on voltage at a time that is different from the time of the first scan line 151, and a third scan line 154 for transmitting the scan signal GI(n+1). In the illustrated embodiment, an example in which the second scan line 152 transmits the gate-on voltage at the time that is prior to the time of the first scan line 151 will be mainly described. In an embodiment, when the scan signal GWn is an n-th scan signal Sn (n is a natural number that is equal to or greater than 1) from among the scan signals applied for one frame, the scan signal GIn may be a previous-stage scan signal such as an (n−1)-th scan signal S(n−1), and the scan signal GI(n+1) may be an n-th scan signal Sn, for example. However, the illustrated embodiment is not limited thereto, and the scan signal GI(n+1) may be a scan signal that is different from the n-th scan signal Sn.

The control line 153 may transmit a control signal, and may particularly transmit an emission control signal EM for controlling emission of the light emitting diode LED included in the pixel PX. The control signal transmitted by the control line 153 may transmit the gate-on voltage and the gate-off voltage, and it may have a waveform that is different from the scan signal transmitted by the scan lines 151, 152, and 154.

The data line 171 may transmit a data signal Dm, and the driving voltage line 172 may transmit a driving voltage ELVDD. The data signal Dm may have different voltage levels depending on an image signal input to the display device, and the driving voltage ELVDD may substantially have a constant level.

Although not shown, the display device may further include a driver for transmitting signals to a plurality of signal lines 127, 151, 152, 153, 154, 171, and 172.

A plurality of transistors T1, T2, T3, T4, T5, T6, and T7 included in one pixel PX may include a first transistor T1, a second transistor T2, a third transistor T3, a fourth transistor T4, a fifth transistor T5, a sixth transistor T6, and a seventh transistor T7.

The first scan line 151 may transmit a scan signal GWn to the second transistor T2 and the third transistor T3, the second scan line 152 may transmit a scan signal GIn to the fourth transistor T4, the third scan line 154 may transmit a scan signal GI(n+1) to the seventh transistor T7, and the control line 153 may transmit an emission control signal EM to the fifth transistor T5 and the sixth transistor T6.

A gate electrode G1 of the first transistor T1 is connected to an end of the capacitor Cst through the driving gate node GN, a first electrode Ea1 of the first transistor T1 is connected to the driving voltage line 172 through the fifth transistor T5, and a second electrode Eb1 of the first transistor T1 is connected to the anode of the light emitting diode LED through the sixth transistor T6. The first transistor T1 may receive a data signal Dm transmitted by the data line 171 according to a switching operation of the second transistor T2 and may supply a driving current Id to the light emitting diode LED.

A gate electrode G2 of the second transistor T2 is connected to the first scan line 151, a first electrode Ea2 of the second transistor T2 is connected to the data line 171, and a second electrode Eb2 of the second transistor T2 is connected to the first electrode Ea1 of the first transistor T1 and is connected to the driving voltage line 172 through the fifth transistor T5. The second transistor T2 may be turned on by the scan signal GWn received through the first scan line 151 and may transmit the data signal Dm provided by the data line 171 to the first electrode Ea1 of the first transistor T1.

A gate electrode G3 of the third transistor T3 is connected to the first scan line 151, and a first electrode Ea3 of the third transistor T3 is connected to the second electrode Eb1 of the first transistor T1 and is connected to the anode of the light emitting diode LED through the sixth transistor T6. A second electrode Eb3 of the third transistor T3 is connected to a second electrode Eb4 of the fourth transistor T4, an end of the capacitor Cst, and a gate electrode G1 of the first transistor T1. The third transistor T3 is turned on by the scan signal GWn received through the first scan line 151 to connect the gate electrode G1 of the first transistor T1 and the second electrode Eb1 and diode-connect the first transistor T1.

A gate electrode G4 of the fourth transistor T4 is connected to the second scan line 152, a first electrode Ea4 of the fourth transistor T4 is connected to an initialization voltage terminal to which the initialization voltage Vint is applied, and a second electrode Eb4 of the fourth transistor T4 is connected to one end of the capacitor Cst and the gate electrode G1 of the first transistor T1 through the second electrode Eb3 of the third transistor T3. The fourth transistor T4 is turned on by the scan signal GIn received through the second scan line 152 to transmit the initialization voltage Vint to the gate electrode G1 of the first transistor T1 and initialize the voltage at the gate electrode G1 of the first transistor T1, thereby performing an initialization operation.

A gate electrode G5 of the fifth transistor T5 is connected to the control line 153, a first electrode Ea5 of the fifth transistor T5 is connected to the driving voltage line 172, and a second electrode Eb5 of the fifth transistor T5 is connected to the first electrode Ea1 of the first transistor T1 and the second electrode Eb2 of the second transistor T2.

A gate electrode G6 of the sixth transistor T6 is connected to the control line 153, a first electrode Ea6 of the sixth transistor T6 is connected to the second electrode Eb1 of the first transistor T1 and the first electrode Ea3 of the third transistor T3, and a second electrode Eb6 of the sixth transistor T6 is electrically connected to the anode of the light emitting diode LED. The fifth transistor T5 and the sixth transistor T6 are simultaneously turned on by the emission control signal EM received through the control line 153, by which the driving voltage ELVDD may be compensated through the diode-connected first transistor T1 and may be transmitted to the light emitting diode LED.

A gate electrode G7 of the seventh transistor T7 is connected to the third scan line 154, a first electrode Ea7 of the seventh transistor T7 is connected to the second electrode Eb6 of the sixth transistor T6 and the anode of the light emitting diode LED, and a second electrode Eb7 of the seventh transistor T7 is connected to the initialization voltage terminal to which the initialization voltage Vint is applied and the first electrode Ea4 of the fourth transistor T4.

The transistors T1, T2, T3, T4, T5, T6, and T7 may be p-type channel transistors such as p-channel metal-oxide-semiconductor ("PMOS") transistors, but they are not limited thereto, and at least one of the transistors T1, T2, T3, T4, T5, T6, and T7 may be an n-type channel transistor, or may include p-type channel transistors and n-type channel transistors.

An end of the capacitor Cst is, as described above, connected to the gate electrode G1 of the first transistor T1, and another end of the capacitor Cst is connected to the driving voltage line 172. A cathode of the light emitting diode LED may be connected to the common voltage terminal for transmitting the common voltage ELVSS and may receive the common voltage ELVSS.

The configuration of the pixel PX in an embodiment is not limited to the structure described with reference to FIG. 4, and a number of the transistors and the capacitors included in one pixel PX are variable in many ways.

Figure 5:
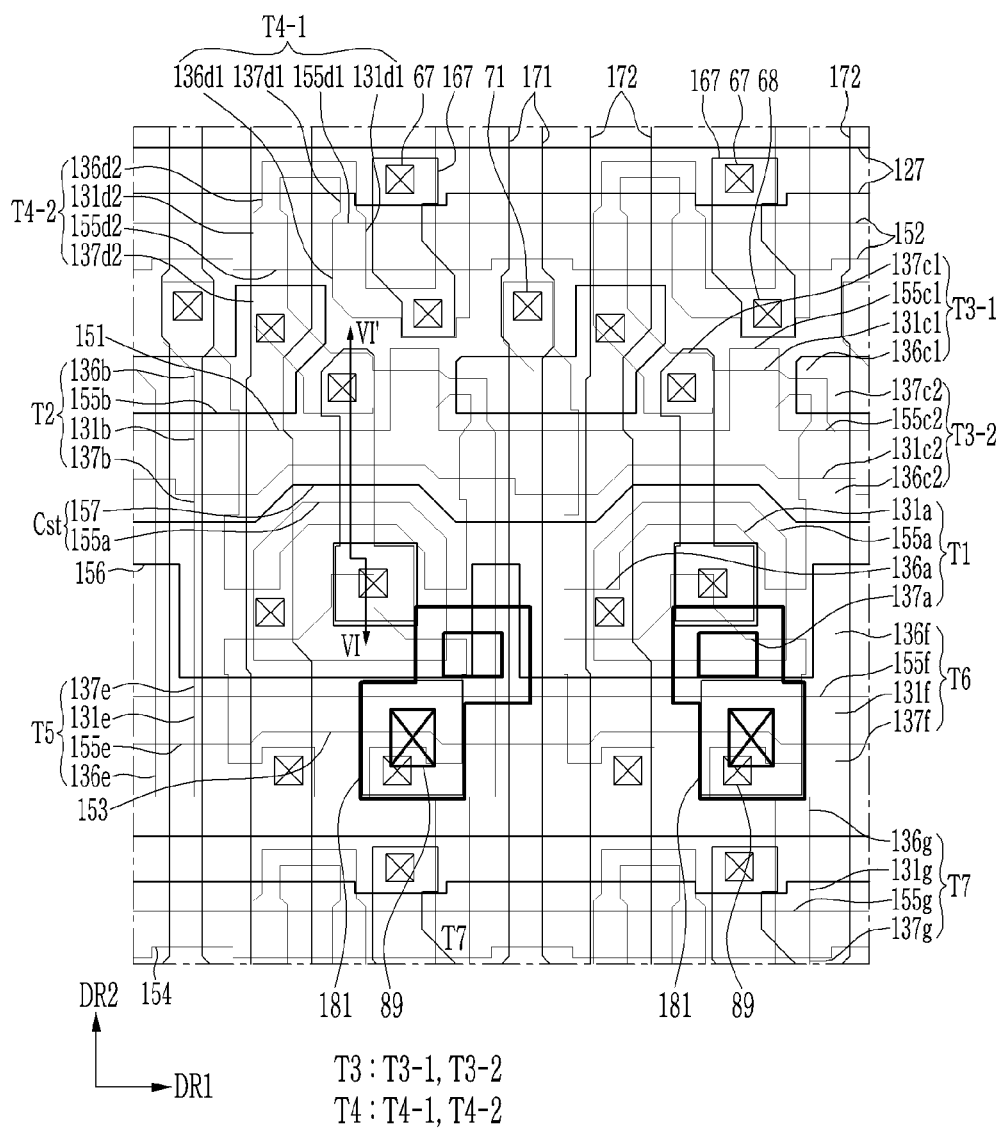
FIG. 5 shows a top plan view of two adjacent pixels.
Figure 6:
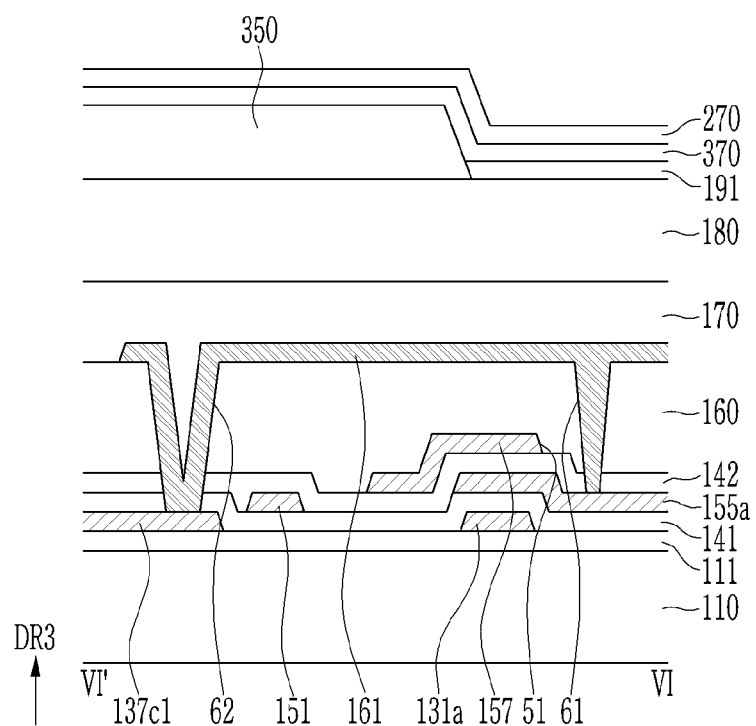
FIG. 6 shows a cross-sectional view with respect to a line VI-VI' of FIG. 5.

A configuration of a display device in an embodiment will now be described with reference to FIG. 4, FIG. 5, FIG. 6, and FIG. 7 to FIG. 11. FIG. 5 shows a top plan view of two adjacent pixels, FIG. 6 shows a cross-sectional view with respect to a line VI-VI' of FIG. 5, and FIG. 7 to FIG. 11 show top plan views of some constituent elements of two adjacent pixels. For ease of description, a planar configuration of a display device in an embodiment will now be described, and a cross-sectional configuration will then be described.

Referring to FIG. 5 and FIG. 7 to FIG. 11, the display device may include a plurality of transistors T1, T2, T3, T4, T5, T6, T7 connected to a plurality of scan lines 151, 152, and 154, a control line 153, a data line 171, and a driving voltage line 172, and a capacitor Cst. The pixel shown in FIG. 5 may be repeatedly disposed in the first direction DR1 and the second direction DR2.

The scan lines 151, 152, and 154 and the control line 153 may substantially extend in a same direction (e.g., first direction DR1) in a plan view. The first scan line 151 may be disposed between the second scan line 152 and the control line 153 in a plan view.

The data line 171 and the driving voltage line 172 may substantially extend in the second direction DR2, and may traverse a plurality of scan lines 151, 152, and 154 and a control line 153 in a plan view. The data line 171 may transmit a data signal Dm, and the driving voltage line 172 may transmit a driving voltage ELVDD. The data line 171 and the driving voltage line 172 may be disposed in different layers.

The display device may further include a storage line 156, an initialization voltage line 127, and a shielding pattern 128.

The storage line 156 may substantially extend in the first direction DR1 that is a horizontal direction in a plan view. The storage line 156 may be disposed between the first scan line 151 and the control line 153 in a plan view. The storage line 156 may include an expansion 157 disposed on each pixel. The storage line 156 may transmit a driving voltage ELVDD. An opening 51 may be defined in a center portion of the expansion 157.

The initialization voltage line 127 may substantially extend in the first direction DR1 to transmit the initialization voltage Vint, and one initialization voltage line 127 may be disposed between two storage lines 156 that are adjacent to each other in the second direction DR2. The initialization voltage line 127 may be disposed near the fourth transistor T4.

The shielding pattern 128 may be disposed between the first scan line 151 and the second scan line 152.

Figure 8:
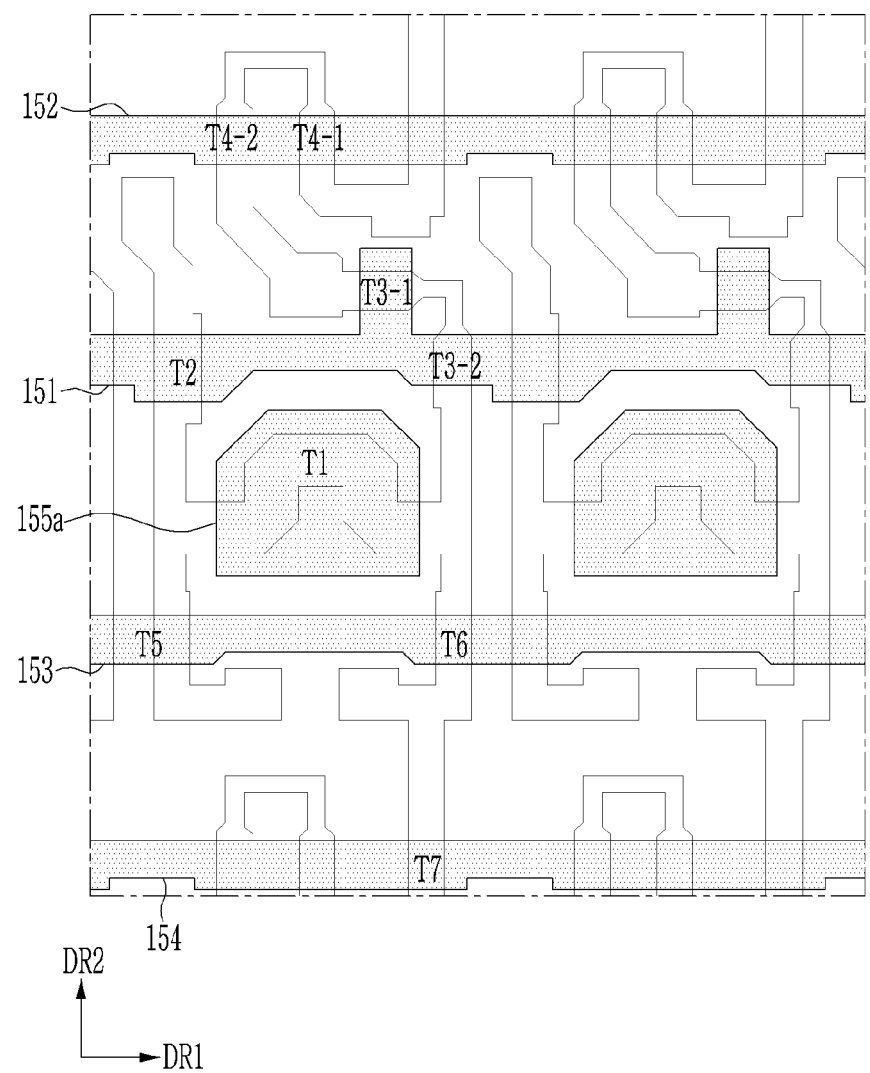

Referring to FIG. 5 and FIG. 8, a plurality of scan lines 151, 152, and 154, a control line 153, and a driving gate electrode 155a may be included in the first conductive layers (151, 152, 153, 154, and 155a), may be disposed in the same layer in a cross-sectional view, and may include the same material.

Figure 9:
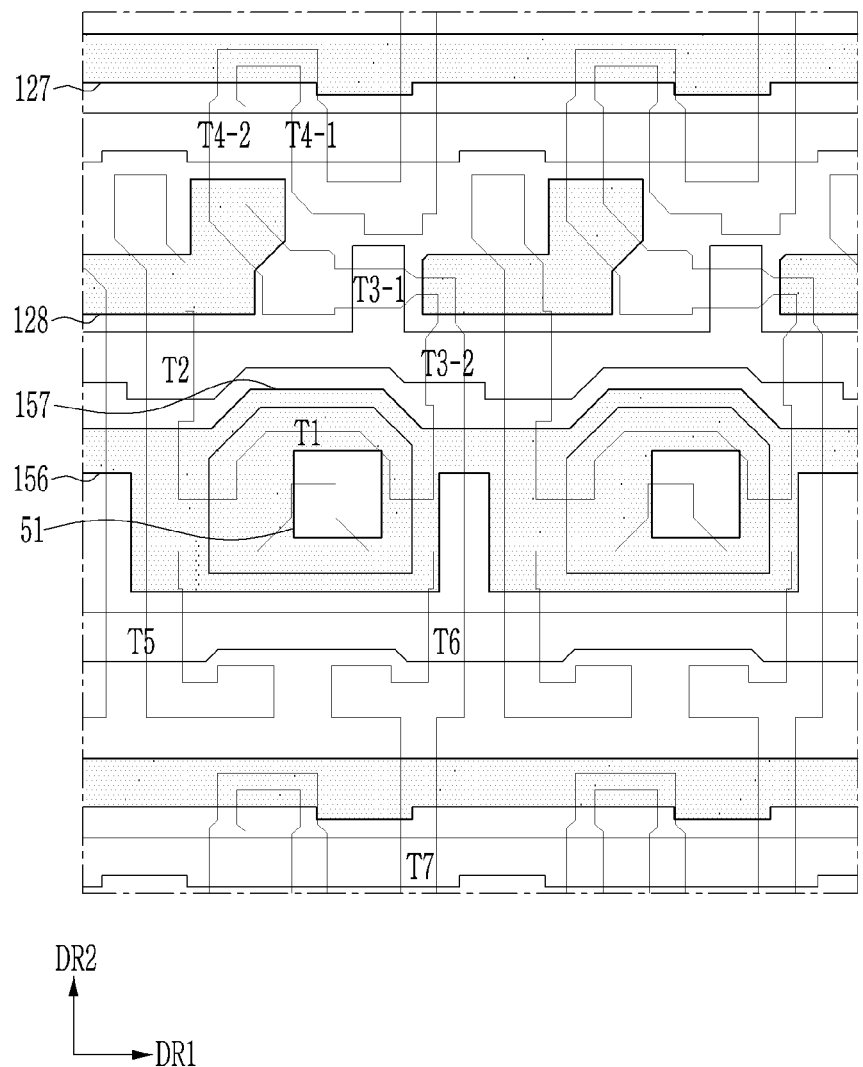
Figure 10:
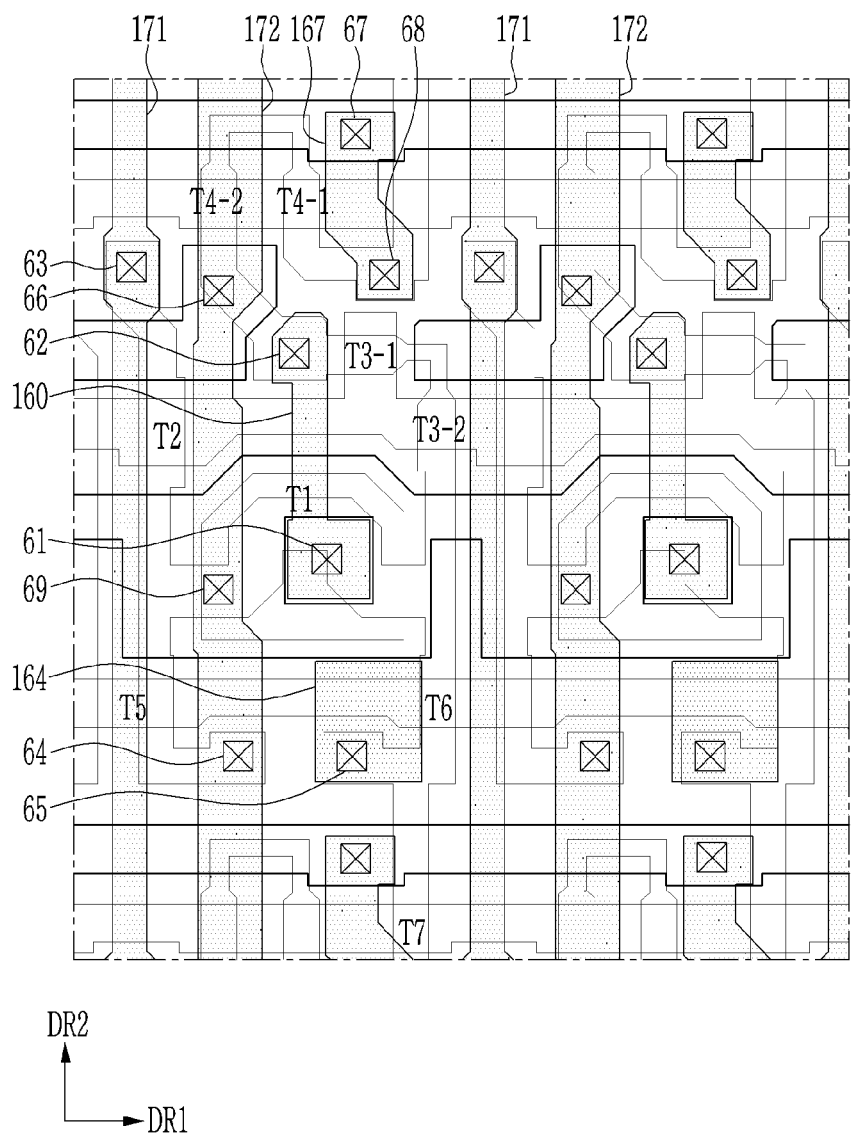

Referring to FIG. 5 and FIG. 9, the storage lines 156 and 157 and the initialization voltage line 127 may be included in second conductive layers (127, 128, 156, and 157) that are different from the first conductive layers (151, 152, 153, 154, and 155a), may be disposed in the same layer in a cross-sectional view, and may include the same material. The second conductive layers (127, 128, 156, and 157) may be disposed on a layer disposed on the first conductive layers (151, 152, 153, 154, and 155a). Referring to FIG. 5 and FIG. 10, the data line 171, the driving voltage line 172, and the connecting members 161, 164, and 167 may be included in third conductive layers (161, 164, 167, 171, and 172) that are different from the first and second conductive layers, they may be disposed in the same layer in a cross-sectional view, and they may include the same material. The third conductive layers (161, 164, 167, 171, and 172) may be disposed on a layer provided on the second conductive layers (127, 128, 156, and 157).

Figure 11:
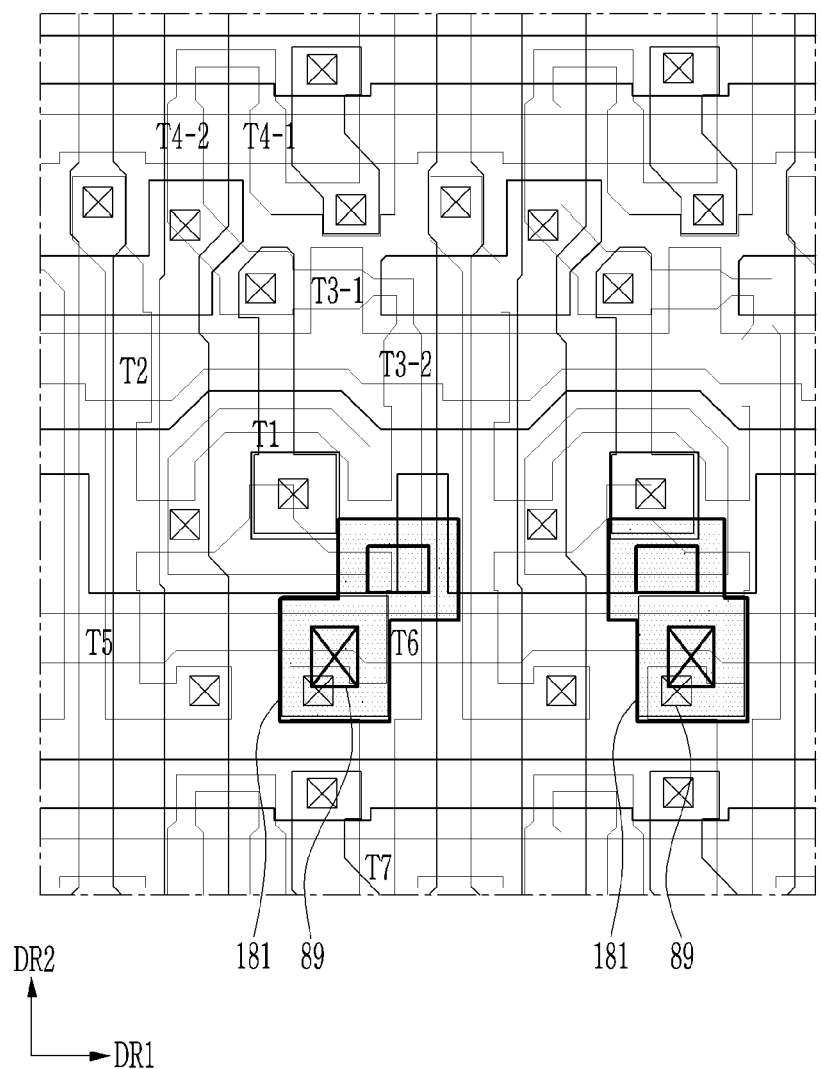

Referring to FIG. 5 and FIG. 11, the display device further includes a connecting member 181, and the connecting member 181 is included in a fourth conductive layer (181) that is different from the first to third conductive layers. The fourth conductive layer (181) may be disposed on a layer that is in the third conductive layers (161, 164, 167, 171, and 172).

Figure 7:
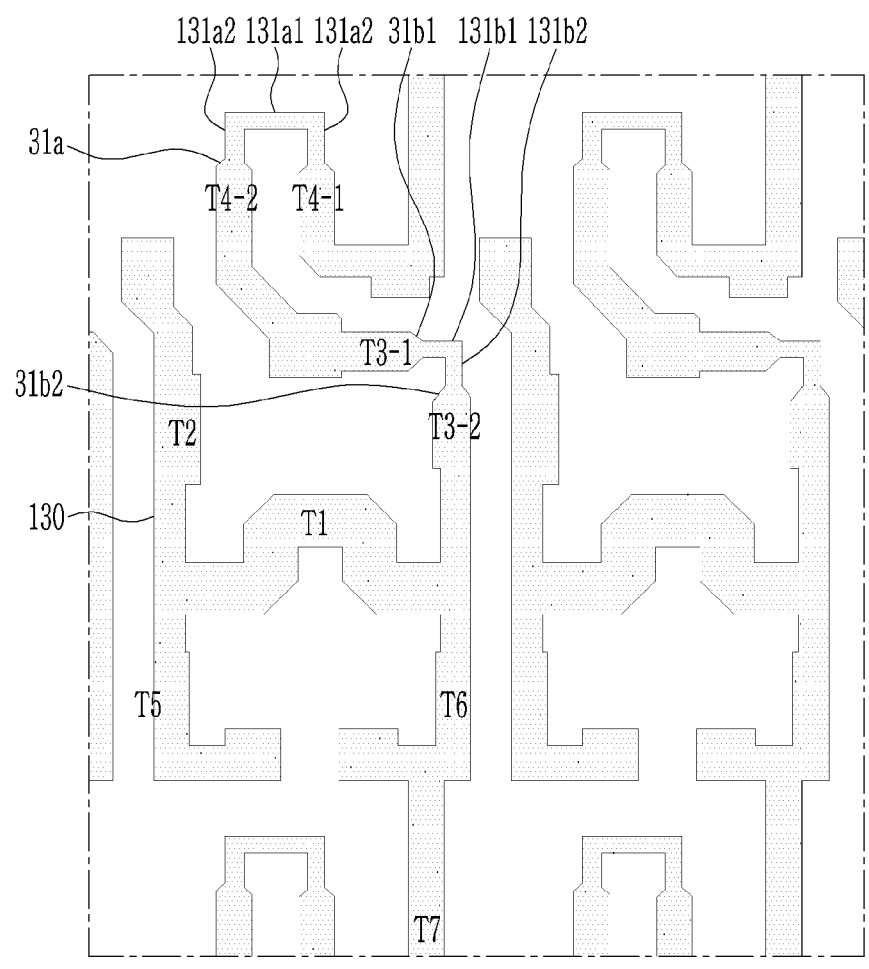
FIG. 7 to FIG. 11 show top plan views of some constituent elements of two adjacent pixels.

Respective channels of a plurality of transistors T1, T2, T3, T4, T5, T6, and T7 may be provided inside the semiconductor layer 130, and the semiconductor layer 130 is not limited to the shape shown in FIG. 7 and may be bent in various shapes. The semiconductor layer 130 may include a semiconductor material such as amorphous/polysilicon or an oxide semiconductor.

Referring to FIG. 5, the semiconductor layer 130 includes a plurality of channel regions and a plurality of conductive regions that are semiconductors. The channel regions include channel regions 131a, 131b, 131c1, 131c2, 131d1, 131d2, 131e, 131f, and 131g for forming respective channels of the transistors T1, T2, T3, T4, T5, T6, and T7. Other portions excluding the channel regions 131a, 131b, 131c1, 131c2, 131d1, 131d2, 131e, 131f, and 131g on the semiconductor layer 130 may be conductive regions. The conductive regions have a higher carrier concentration than those of the channel regions 131a, 131b, 131c1, 131c2, 131d1, 131d2, 131e, 131f, and 131g. A pair of conductive regions disposed on respective sides of the channel regions 131a, 131b, 131c1, 131c2, 131d1, 131d2, 131e, 131f, and 131g may be first electrode regions and second electrode regions of the transistors T1, T2, T3, T4, T5, T6, and T7.

The first transistor T1 includes a channel region 131a, a first electrode region 136a and a second electrode region 137a disposed on respective sides of the channel region 131a, and a driving gate electrode 155a overlapping the channel region 131a in a plan view.

The channel region 131a may be bent at least once. In an embodiment, the channel region 131a may have a meandering shape or a zigzag shape, for example. FIG. 5 and FIG. 7 show an example in which the channel region 131a includes a U shape that is substantially reversed up and down.

The driving gate electrode 155a may be connected to the first connecting member 161 through the contact hole 61, as shown in FIG. 10. The contact hole 61 is position in the opening 51 of the expansion 157 of the storage line 156. The first connecting member 161 may extend substantially in the perpendicular direction and may traverse the first scan line 151. The first connecting member 161 corresponds to the driving gate node GN shown in the circuit diagram of FIG. 4 together with the driving gate electrode 155a.

The second transistor T2 includes a channel region 131b, a first electrode region 136b and a second electrode region 137b disposed on respective sides of the channel region 131b, and a gate electrode 155b overlapping the channel region 131b in a plan view. The gate electrode 155b is part of the first scan line 151. The first electrode region 136b is connected to the data line 171 through the contact hole 63, and the second electrode region 137b is connected to the first electrode region 136a of the first transistor T1.

The first electrode region 136b may be electrically connected to the data line 171 to receive a data signal Dm.

The third transistor T3 may include two portions to prevent a leakage current. That is, the third transistor T3 may include a first portion T3-1 and a second portion T3-2 that are disposed near each other and are connected to each other.

The first portion T3-1 of the third transistor T3 includes a channel region 131c1 overlapping the first scan line 151 in a plan view, a first electrode region 136c1 and a second electrode region 137c1 disposed on respective sides of the channel region 131c1, and a gate electrode 155c1 overlapping the channel region 131c1. The gate electrode 155c1 may be part of the protrusion of the first scan line 151. The second electrode region 137c1 is connected to the first connecting member 161 through the contact hole 62.

The second portion T3-2 of the third transistor T3 includes a channel region 131c2 overlapping the first scan line 151 in a plan view, a first electrode region 136c2 and a second electrode region 137c2 disposed on respective sides of the channel region 131c2, and a gate electrode 155c2 overlapping the channel region 131c2. The gate electrode 155c2 is part of the first scan line 151. The first electrode region 136c2 of the second portion T3-2 of the third transistor T3 is connected to the second electrode region 137a of the first transistor T1, and the second electrode region 137c2 is connected to the first electrode region 136c1 of the first portion T3-1 of the third transistor T3.

A first connecting portion 131b1 and a second connecting portion 131b2 may be disposed between the channel region 131c1 of the first portion T3-1 of the third transistor T3 and the channel region 131c2 of the second portion T3-2 of the third transistor T3, a first inclined portion 31b1 may be disposed between the channel region 131c1 and the first connecting portion 131b1, and a second inclined portion 31b2 may be disposed between the channel region 131c2 and the second connecting portion 131b2. The channel region 131c1 of the first portion T3-1 of the third transistor T3 and the first connecting portion 131b1 may extend in parallel to the first direction DR1, and the channel region 131c2 of the second portion T3-2 of the third transistor T3 and the second connecting portion 131b2 may extend in parallel to the second direction DR2. The first inclined portion 31b1 and the second inclined portion 31b2 may have edges that are inclined to have a predetermined angle with respect to the first direction DR1 and the second direction DR2.

A width of the first connecting portion 131b1 and a width of the second connecting portion 131b2 may be less than a width of the channel region 131c1 of the first portion T3-1 of the third transistor T3 and the channel region 131c2 of the second portion T3-2 of the third transistor T3.

The fourth transistor T4 may be provided with two portions so as to prevent a leakage current. That is, the fourth transistor T4 may include a first portion T4-1 and a second portion T4-2 that are adjacent to each other and are connected to each other. The first portion T4-1 of the fourth transistor T4 and the second portion T4-2 of the fourth transistor T4 may be disposed on a portion where the second scan line 152 shown at an upper portion of FIG. 5 passes through.

The first portion T4-1 of the fourth transistor T4 includes a channel region 131d1 overlapping the second scan line 152 in a plan view, a first electrode region 136d1 and a second electrode region 137d1 disposed on respective sides of the channel region 131d1, and a gate electrode 155d1 overlapping the channel region 131d1. The gate electrode 155d1 is part of the second scan line 152. The first electrode region 136d1 may, as shown in FIG. 10, be connected to the initialization voltage line 127 through the contact holes 67 and 68, and the second electrode region 137d1 is connected to the first electrode region 136d2 of the second portion T4-2 of the fourth transistor T4.

The second portion T4-2 of the fourth transistor T4 includes a channel region 131d2 overlapping the second scan line 152 in a plan view, a first electrode region 136d2 and a second electrode region 137d2 disposed on respective sides of the channel region 131d2, and a gate electrode 155d2 overlapping the channel region 131d2. The gate electrode 155d2 is part of the second scan line 152.

One first connecting portion 131a1, two second connecting portions 131a2, and two inclined portions 31a are disposed between the channel region 131d1 of the first portion T4-1 of the fourth transistor T4 and the channel region 131d2 of the second portion T4-2 of the fourth transistor T4. The first connecting portion 131a1 extends in parallel to the first direction DR1. The two second connecting portions 131a2 extend in parallel to the second direction DR2. The two second connecting portions 131a2 may be disposed between the channel region 131d1 and the first connecting portion 131a1 and between the channel region 131d2 and the first connecting portion 131a1. The two inclined portions 31a may have edges that are inclined with a predetermined angle with respect to the first direction DR1 and the second direction DR2, and the two inclined portions 31a may be disposed between the channel region 131d1 and the second connecting portion 131a2 and between the channel region 131d2 and the second connecting portion 131a2.

A width of the first connecting portion 131a1 and a width of the second connecting portion 131a2 may be less than a width of the channel region 131d1 of the first portion T4-1 of the fourth transistor T4 and the channel region 131d2 of the second portion T4-2 of the fourth transistor T4.

The fifth transistor T5 includes a channel region 131e, a first electrode region 136e and a second electrode region 137e disposed on respective sides of the channel region 131e, and a gate electrode 155e overlapping the channel region 131e. The gate electrode 155e is part of the control line 153. The first electrode region 136e is, as shown in FIG. 10, connected to the driving voltage line 172 through the contact hole 64, and the second electrode region 137e is connected to the first electrode region 136a of the first transistor T1. The first electrode region 136e may be electrically connected to the driving voltage line 172 to receive a driving voltage ELVDD.

The sixth transistor T6 includes a channel region 131f, a first electrode region 136f and a second electrode region 137f disposed on respective sides of the channel region 131f, and a gate electrode 155f overlapping the channel region 131f. The gate electrode 155f is part of the control line 153. The first electrode region 136f is connected to the second electrode region 137a of the first transistor T1, and the second electrode region 137f is, as shown in FIG. 10, connected to the second connecting member 164 through the contact hole 65.

The seventh transistor T7 includes a channel region 131g, a first electrode region 136g and a second electrode region 137g disposed on respective sides of the channel region 131g, and a gate electrode 155g overlapping the channel region 131g. The gate electrode 155g is part of the third scan line 154. The first electrode region 136g is connected to the second electrode region 137f of the sixth transistor T6, and the second electrode region 137g is, as shown in FIG. 10, connected to the initialization voltage line 127 through the contact hole 68 to receive an initialization voltage Vint.

The capacitor Cst may maintain the voltage at the driving gate electrode 155a. The capacitor Cst includes the driving gate electrode 155a and the expansion 157 of the storage line 156 overlapping each other in a plan view as two terminals. The expansion 157 of the storage line 156 may have a greater area than that of the driving gate electrode 155a in a plan view, and may cover the entire area of the driving gate electrode 155a. The shielding pattern 128 may be connected to the driving voltage line 172 through the contact hole 66. As described, the driving voltage line 172 is connected to the shielding pattern 128, and the driving voltage ELVDD that is a constant direct current ("DC") voltage is applied to the shielding pattern 128, thereby preventing the image quality characteristic from being changed. The shielding pattern 128 may be disposed in a region that is different from the illustrated region, and a voltage that is different from the driving voltage ELVDD may be applied.

A stacking structure of a display device according to the above-described embodiment will now be described in detail with reference to FIG. 5 to FIG. 11.

Referring to FIG. 5, FIG. 6, and FIG. 8 to FIG. 12, the display device in the embodiment may include a substrate 110. In an embodiment, the substrate 110 may include an inorganic insulating material such as glass or an organic insulating material such as plastic like a polyimide (PI). The substrate 110 may have flexibility with a wide range.

A buffer layer 111 may be disposed on the substrate 110. The buffer layer 111 may prevent degradation of the characteristic of the semiconductor layer 130 and may ease stresses by blocking transmission of impurities to an upper layer of the buffer layer 111, particularly the semiconductor layer 130, from the substrate 110. The buffer layer 111 may include an inorganic insulating material or an organic insulating material such as a silicon nitride or a silicon oxide. Part of or the entire buffer layer 111 may be omitted.

A semiconductor layer 130 is disposed on the buffer layer 111 as shown in FIG. 7, and a first insulating layer 141 is disposed on the semiconductor layer 130. The first insulating layer 141 may include an inorganic insulating material or an organic insulating material such as a silicon nitride or a silicon oxide.

First conductive layers (151, 152, 153, 154, and 155a) including a plurality of scan lines 151, 152, and 154, a control line 153, and a driving gate electrode 155a may be disposed on the first insulating layer 141 as shown in FIG. 8.

A second insulating layer 142 is disposed on the first conductive layers (151, 152, 153, 154, and 155a) and the first insulating layer 141. The second insulating layer 142 may include an inorganic insulating material or an organic insulating material such as a silicon nitride or a silicon oxide.

Second conductive layers (127, 128, 156, and 157) including a storage line 156 and an initialization voltage line 127 may be disposed on the second insulating layer 142 as shown in FIG. 9. The expansion 157 of the storage line 156 may overlap the driving gate electrode 155a with the second insulating layer 142 therebetween to form a capacitor Cst.

A third insulating layer 160 may be disposed on the second conductive layers (127, 128, 156, and 157) and the second insulating layer 142. The third insulating layer 160 may include an inorganic insulating material or an organic insulating material such as a silicon nitride or a silicon oxide.

Third conductive layers (161, 164, 167, 171, and 172) including a first connecting member 161, a second connecting member 164, a third connecting member 167, a data line 171, and a driving voltage line 172 are disposed on the third insulating layer 160, as shown in FIG. 10. The data line 171 and the driving voltage line 172 may traverse a plurality of scan lines 151, 152, and 154, a control line 153, a first initialization voltage line 127, and a storage line 156.

The first connecting member 161 is electrically connected to the driving gate electrode 155a, the second electrode region 137c1 of the first portion T3-1 of the third transistor T3, and the second electrode region 137d2 of the second portion T4-2 of the fourth transistor T4 through the contact holes 61 and 62. The second connecting member 164 may be electrically connected to the second electrode region 137f of the sixth transistor T6 through the contact hole 64.

The third connecting member 167 is electrically connected to the initialization voltage line 127 through the contact hole 67, and is electrically connected to the first electrode region 136d1 of the fourth transistor T4 through the contact hole 68. The third connecting member 167 transmits the initialization voltage Vint to the fourth transistor T4.

The driving voltage line 172 may be electrically connected to the first electrode region 136e of the fifth transistor T5 through the contact hole 64, and may be electrically connected to the expansion 157 of the storage line 156 through the contact hole 69. The expansion 157 may be connected to the driving voltage line 172 through the contact hole 69 and may receive the driving voltage ELVDD.

The driving voltage line 172 may be connected to the shielding pattern 128 through the contact hole 66, and the shielding pattern 128 may receive the driving voltage ELVDD from the driving voltage line 172.

The data line 171 may be connected to the first electrode region 136b through the contact hole 63. The first electrode region 136b may receive the data voltage from the data line 171.

A fourth insulating layer 170 may be disposed on the third conductive layers (161, 164, 167, 171, and 172) and the third insulating layer 160. The fourth insulating layer 170 may include an inorganic insulating material and/or an organic insulating material such as a silicon nitride or a silicon oxide.

As shown in FIG. 11, a fourth conductive layer (181) including a connecting member 181 may be disposed on the fourth insulating layer 170.

A fifth insulating layer 180 is disposed on the fourth conductive layer (181) and the fourth insulating layer 170. The fifth insulating layer 180 may include an organic insulating material such as a polyacryl-based resin or polyimide-based resin. An upper side of the fifth insulating layer 180 may be substantially planar.

A fifth conductive layer including a pixel electrode 191 may be disposed on the fifth insulating layer 180. The pixel electrode 191 may be connected to the second connecting member 164 through the contact hole 89. A partition wall 350 may be disposed on the fifth insulating layer 180 and the pixel electrode 191. An opening in which the pixel electrode 191 is disposed is defined in the partition wall 350. An emission layer 370 is disposed on the pixel electrode 191. The emission layer 370 may be disposed in the opening of the partition wall 350. The emission layer 370 may include an organic emitting material or an inorganic emitting material. A common electrode 270 is disposed on the emission layer 370. The common electrode 270 is also disposed on the partition wall 350 and may extend throughout a plurality of pixels. The pixel electrode 191, the emission layer 370, and the common electrode 270 configure a light emitting diode LED. A sealing layer (not shown) for protecting the light emitting diode LED may be further disposed on the common electrode 270. The sealing layer may include an inorganic film and an organic film that are alternately stacked, may include the inorganic film, or may include the organic film.

Figure 12:
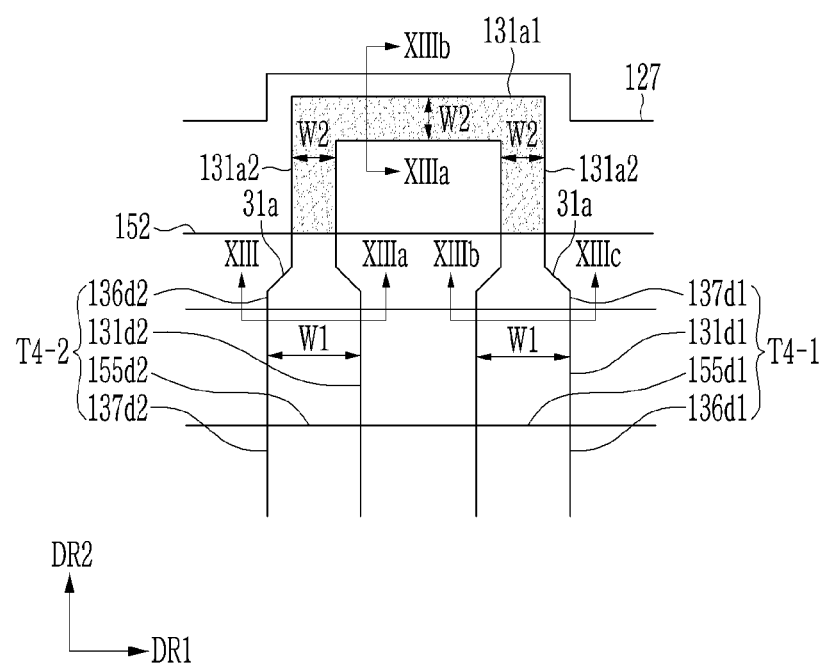
FIG. 12 shows a top plan view of part of FIG. 5.
Figure 13:
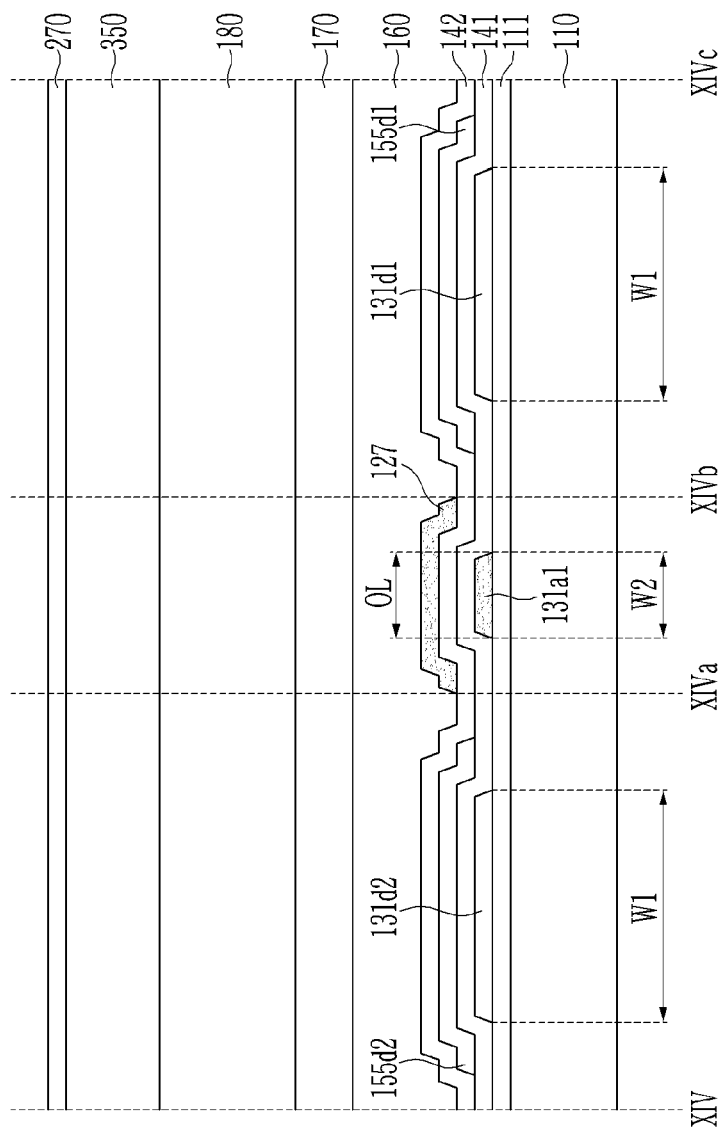
FIG. 13 shows a cross-sectional view with respect to a line XIII-XIIIa-XIIIb-XIIIc of FIG. 12.

A portion of a display device in an embodiment will now be described in detail with reference to FIG. 5, FIG. 7, FIG. 12, and FIG. 13. FIG. 12 shows a top plan view of part of FIG. 5, and FIG. 13 shows a cross-sectional view with respect to a line XIII-XIIIa-XIIIb-XIIIc of FIG. 12. FIG. 12 and FIG. 13 illustrate first and second portions T4-1 and T4-2 of the fourth transistor T4.

Referring to FIG. 12 and FIG. 13, a buffer layer 111 is disposed on the substrate 110, and a semiconductor layer including a channel region 131d1, a first electrode region 136d1, a second electrode region 137d1, a channel region 131d2, a first electrode region 136d2, a second electrode region 137d2, a first connecting portion 131a1, a second connecting portion 131a2, and inclined portions 31a is disposed on the buffer layer 111.

A first insulating layer 141 is disposed on the semiconductor layer, and a second scan line 152 (refer to FIG. 5) including gate electrodes 155d1 and 155d2 is disposed on the first insulating layer 141.

A second insulating layer 142 is disposed on the second scan line 152, and an initialization voltage line 127 is disposed on the second insulating layer 142. A third insulating layer 160 (refer to FIG. 6), a fourth insulating layer 170 (refer to FIG. 6), a fifth insulating layer 180, a partition wall 350, and a common electrode 270 are disposed on the initialization voltage line 127.

One first connecting portion 131a1, two second connecting portions 131a2, and two inclined portions 31a are disposed between the channel region 131d1 and the channel region 131d2. The first connecting portion 131a1 extends in parallel to the first direction DR1. The two second connecting portions 131a2 extend in parallel to the second direction DR2. The two second connecting portions 131a2 may be disposed between the channel region 131d1 and the first connecting portion 131a1 and between the channel region 131d2 and the first connecting portion 131a1. The two inclined portions 31a may have edges that are inclined with a predetermined angle with respect to the first direction DR1 and the second direction DR2, and the two inclined portions 31a may be disposed between the channel region 131d1 and the second connecting portion 131a2 and between the channel region 131d2 and the second connecting portion 131a2.

A second width W2 of the first connecting portion 131a1 and the second connecting portion 131a2 may be less than a first width W1 of the channel region 131d1 and the channel region 131d2.

The first connecting portion 131a1 and the second connecting portion 131a2 overlap a portion of the initialization voltage line 127 in a top-to-bottom direction with the second insulating layer 142 therebetween. A second width W2 of the first connecting portion 131a1 and the second connecting portion 131a2 is less than a first width W1 of the channel region 131d1 and the channel region 131d2, so an overlapping area OL of the first connecting portion 131a1 and the second connecting portion 131a2 and the initialization voltage line 127 may be reduced without reducing the channel width of the first and second portions T4-1 and T4-2 of the fourth transistor T4.

The parasitic capacitance among the first connecting portion 131a1, the second connecting portion 131a2, and the initialization voltage line 127 is changed by a difference between on/off voltages of the initialization voltage line 127, and the gate voltages of the first and second portions T4-1 and T4-2 of the fourth transistor T4 may also be changed. However, in an embodiment, the change of the gate voltages at the first and second portions T4-1 and T4-2 of the fourth transistor T4 caused by parasitic capacitance may be prevented, and deterioration of displaying quality, such as afterimages caused by the change of the gate voltage at the transistor may be prevented by reducing the overlapping area OL of the first connecting portion 131a1, the second connecting portion 131a2, and the initialization voltage line 127 without reducing the channel width of the first and second portions T4-1 and T4-2 of the fourth transistor T4.

One portion of a display device in an embodiment will now be described with reference to FIG. 5 and FIG. 7, and FIG. 14 and FIG. 15

Figure 14:
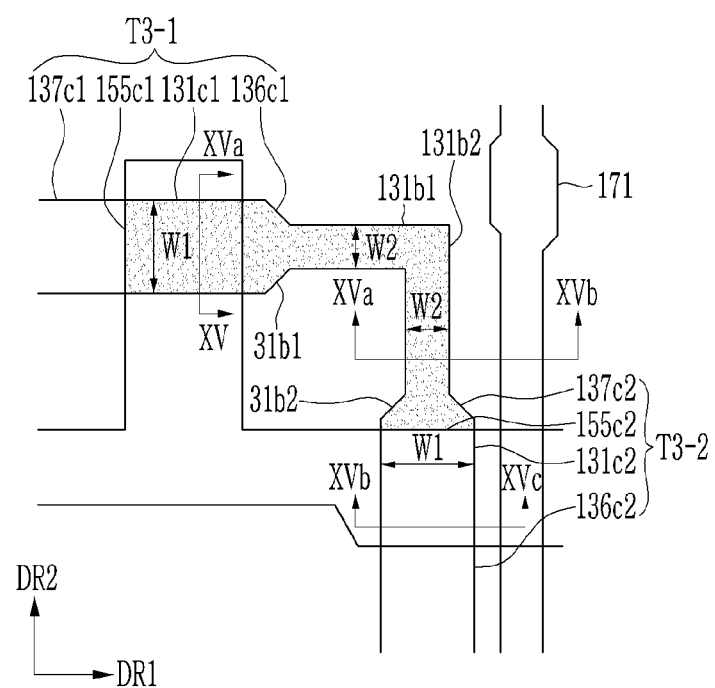
FIG. 14 shows a top plan view of part of FIG. 5.
Figure 15:
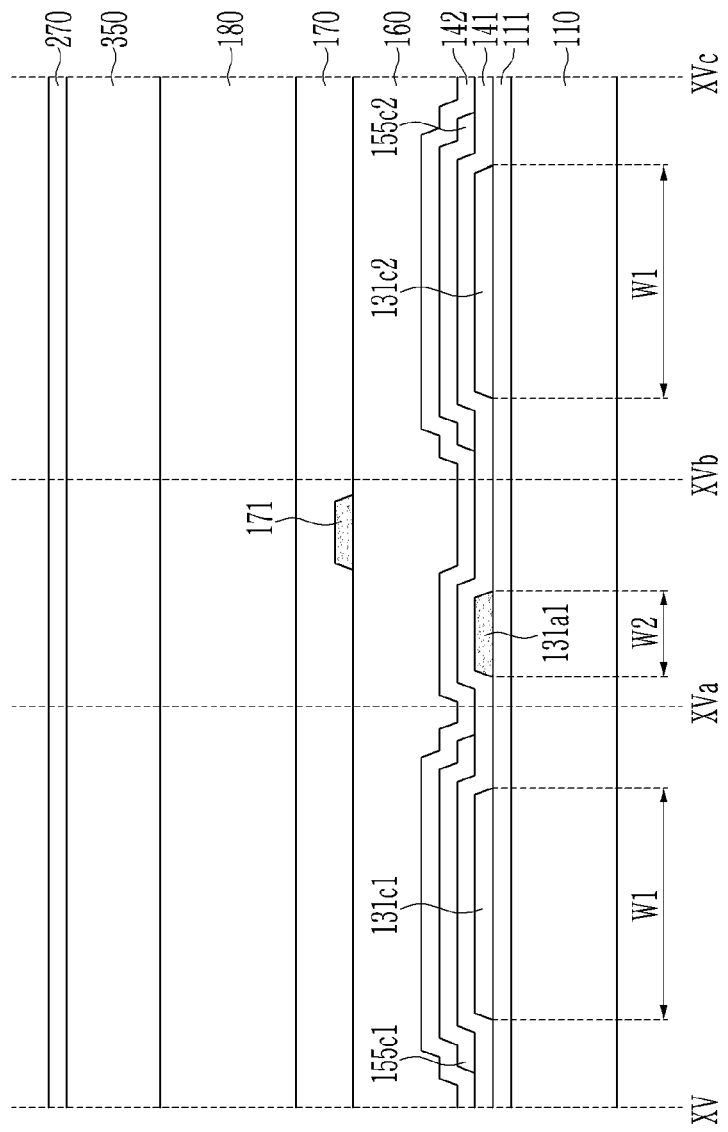
FIG. 15 shows a cross-sectional view with respect to a line XV-XVa-XVb-XVc of FIG. 14.

FIG. 14 shows a top plan view of part of FIG. 5, and FIG. 15 shows a cross-sectional view with respect to a line XV-XVa-XVb-XVc of FIG. 14. FIG. 14 and FIG. 15 illustrate first and second portions T3-1 and T3-2 of the third transistor T3.

Referring to FIG. 14 and FIG. 15, a buffer layer 111 is disposed on the substrate 110, and a semiconductor layer including a channel region 131c1, a first electrode region 136c1, a second electrode region 137c1, a channel region 131c2, a first electrode region 136c2, a second electrode region 137c2, a first connecting portion 131b1, a second connecting portion 131b2, a first inclined portion 31b1, and a second inclined portion 31b2 is disposed on the buffer layer 111.

A first insulating layer 141 is disposed on the semiconductor layer, and a first scan line 151 (refer to FIG. 5) including gate electrodes 155c1 and 155c2 is disposed on the first insulating layer 141.

A second insulating layer 142 is disposed on the first scan line 151, and a third insulating layer 160 (refer to FIG. 6) is disposed on the second insulating layer 142. A data line 171 is disposed on the third insulating layer 160, and a fourth insulating layer 170, a fifth insulating layer 180, a partition wall 350, and a common electrode 270 are disposed on the data line 171.

A first connecting portion 131b1 and a second connecting portion 131b2 may be disposed between the channel region 131c1 of the first portion T3-1 of the third transistor T3 and the channel region 131c2 of the second portion T3-2 of the third transistor T3, a first inclined portion 31b1 may be disposed between the channel region 131c1 and the first connecting portion 131b1, and a second inclined portion 31b2 may be disposed between the channel region 131c2 and the second connecting portion 131b2. The channel region 131c1 of the first portion T3-1 of the third transistor T3 and the first connecting portion 131b1 may extend in parallel to the first direction DR1, and the channel region 131c2 of the second portion T3-2 of the third transistor T3 and the second connecting portion 131b2 may extend in parallel to the second direction DR2. The first inclined portion 31b1 and the second inclined portion 31b2 may have edges that are inclined with a predetermined angle with respect to the first direction DR1 and the second direction DR2.

A width of the first connecting portion 131b1 and the second connecting portion 131b2 may be less than a width of the channel region 131c1 of the first portion T3-1 of the third transistor T3 and the channel region 131c2 of the second portion T3-2 of the third transistor T3.

The first connecting portion 131b1 and the second connecting portion 131b2 are disposed near the data line 171 with the insulating layers 141, 142, and 160 therebetween. A second width W2 of the first connecting portion 131b1 and the second connecting portion 131b2 is less than a first width W1 of the channel region 131c1 and the channel region 131c2, so parasitic capacitance among the first connecting portion 131b1, the second connecting portion 131b2, and the data line 171 may be reduced without reducing the channel width of the first and second portions T3-1 and T3-2.

The parasitic capacitance among the first connecting portion 131b1, the second connecting portion 131b2, and the data line 171 is changed according to the size of the data voltage applied to the data line 171, and the gate voltages at the first and second portions T3-1 and T3-2 may also be changed. However, in an embodiment, the change of the gate voltages at the first and second portions T3-1 and T3-2 caused by parasitic capacitance may be prevented, and deterioration of displaying quality such as afterimages according to the change of the gate voltage at the transistor may be prevented by reducing the parasitic capacitance among the first connecting portion 131b1, the second connecting portion 131b2, and the data line 171 without reducing the channel width of the first and second portions T3-1 and T3-2.

An experimental example will now be described with reference to FIG. 16 and Table 1. In the experimental example, afterimages on the screen are measured regarding the first case c1 in which the first width W1 of the channel region 131c1 and the channel region 131c2 of the first and second portions T3-1 and T3-2 is the same as a second width W2 of the first connecting portion 131b1 and the second connecting portion 131b2, and the second case c2 in which the second width W2 of the first connecting portion 131b1 and the second connecting portion 131b2 of the first and second portions T3-1 and T3-2 is less than the first width W1 of the channel region 131c1 and the channel region 131c2 in a like manner of the display device in an embodiment, and corresponding results are shown in Table 1 and FIG. 16. Regarding the screen afterimages, numerical values relating to a contrast ratio of a predetermined gray are measured while applying voltages according to a minimum gray value and a maximum gray value, and when an absolute value of a numerical value is small, it signifies that the change of the contrast ratio is small, and also signifies that the screen afterimage is small.

Referring to Table 1, compared to the first case c1, an absolute value of an average of values measured twice is reduced to 23.62 from 55.47 in the second case c2, and hence, the screen afterimage of the second case c2 in an embodiment is small compared to the first case c1.

TABLE 1

| Case | First time | Second time | Average |
|------|------------|-------------|---------|
| c1 | −57.05 | −53.89 | −55.47 |
| c2 | −23.87 | −23.18 | −23.62 |

Figure 16:
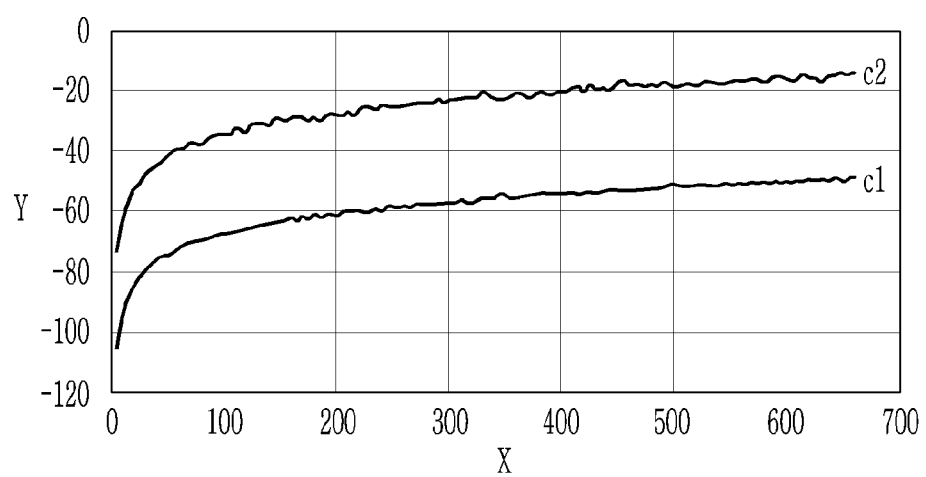
FIG. 16 to FIG. 18 show graphs of results of experimental examples.

In FIG. 16, the X axis represents time, and the Y axis indicates a numerical value meaning a contrast changing rate. Referring to FIG. 16, it is found that the screen afterimage of the second case c2 in an embodiment is small compared to the first case c1. An experimental example will now be described with reference to FIG. 17.

In the experimental example, a signal wire for transmitting a predetermined signal and a semiconductor layer overlap each other, and capacitance caused by the overlapping of the signal wire and the semiconductor layer is measured while changing the width of the semiconductor layer.

Figure 17:
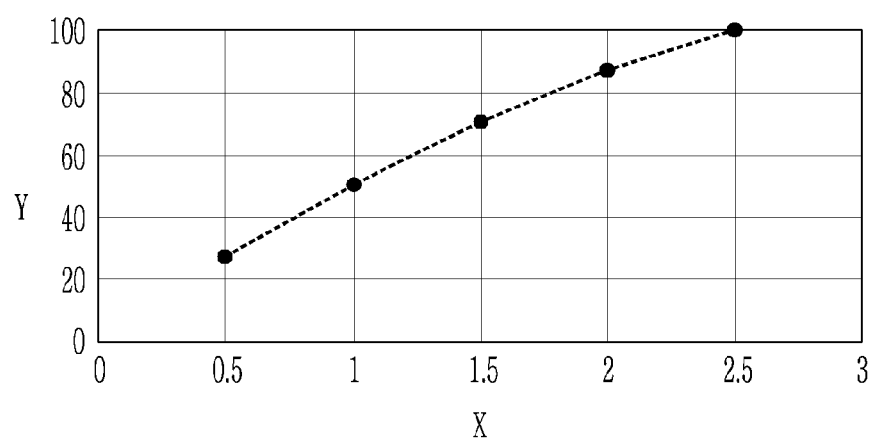

In FIG. 17, the X axis represents a width of a semiconductor layer, and the Y axis indicates capacitance.

Referring to FIG. 17, it is found that, as the width of the semiconductor layer is reduced, the capacitance according to the overlapping of the signal wire and the semiconductor layer is reduced.

As described, in a like manner of the display device in an embodiment, it is found that the unneeded parasitic capacitance may be reduced by forming the second width W2 of the first connecting portion 131b1 and the second connecting portion 131b2 of the first and second portions T3-1 and T3-2 and the first connecting portion 131a1 and the second connecting portion 131a2 of the first and second portions T4-1 and T4-2 to be less than the first width W1 of the channel regions 131c1 and 131c2 and the channel regions 131d1 and 131d2.

An experimental example will now be described with reference to FIG. 18. In the experimental example, a transfer curve with respect to the gate voltage is measured for the first case c1 in which the first width W1 of the channel region 131c1 and the channel region 131c2 of the first and second portions T3-1 and T3-2 is equivalent to the second width W2 of the first connecting portion 131b1 and the second connecting portion 131b2, and the second case c2 in which, in a like manner of the display device in an embodiment, the second width W2 of the first connecting portion 131b1 and the second connecting portion 131b2 of the first and second portions T3-1 and T3-2 is less than the first width W1 of the channel region 131c1 and the channel region 131c2.

Figure 18:
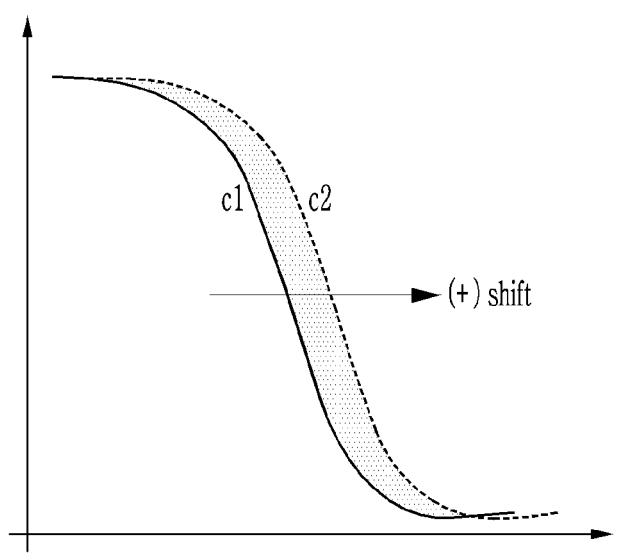

Referring to FIG. 18, it is found that, compared to the second case c2 in an embodiment, the curve is shifted to the right in the first case c1. This signifies that a threshold voltage value increases and performance of the transistor is accordingly deteriorated. As described, it is found that, compared to the second case c2 in an embodiment, the performance of the transistor is deteriorated, and deterioration of displaying quality such as the screen afterimages is generated in the first case c1.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the invention.

What is claimed is:

1. A transistor substrate comprising:
   a substrate;
   a semiconductor layer disposed on the substrate, and including:
      a first channel portion;
      a second channel portion; and
      a connecting portion disposed between the first channel portion and the second channel portion;
   a first insulating layer disposed on the semiconductor layer; and
   a gate conductor disposed on the first insulating layer, and including:
      a first gate electrode overlapping the first channel portion; and
      a second gate electrode overlapping the second channel portion,
   wherein the first channel portion and the second channel portion of the semiconductor layer each have a first width in directions respectively perpendicular to main extension directions of the respective first and second channel portions, and
   the first width is greater than a second width of the connecting portion extending directly from the respective first and second channel portions in a direction perpendicular to a main extension direction of the connecting portion being the same as the respective main extension directions of the respective first and second channel portions.

2. The transistor substrate of claim 1, further comprising:
a second insulating layer disposed on the gate conductor; and
a signal line disposed on the second insulating layer, wherein the connecting portion overlaps the signal line with the second insulating layer therebetween.

3. The transistor substrate of claim 2, wherein
the connecting portion further includes a first connecting portion extending in a first direction and two second connecting portions extending in a second direction which is different from the first direction and disposed on respective sides of the first connecting portion.

4. The transistor substrate of claim 3, wherein
the semiconductor layer further includes a first inclined portion disposed between the first channel portion and the connecting portion and a second inclined portion disposed between the second channel portion and the connecting portion, and
edges of the first inclined portion and the second inclined portion are inclined with a predetermined angle with respect to the first direction and the second direction.

5. The transistor substrate of claim 1, wherein
the connecting portion further includes a first connecting portion extending in a first direction and a second connecting portion extending in a second direction which is different from the first direction.

6. The transistor substrate of claim 5, wherein
the semiconductor layer further includes a first inclined portion disposed between the first channel portion and the connecting portion and a second inclined portion disposed between the second channel portion and the connecting portion, and
edges of the first inclined portion and the second inclined portion are inclined with a predetermined angle with respect to the first direction and the second direction.

7. A display device comprising:
a substrate;
a semiconductor layer disposed on the substrate, and including:
  a first channel portion;
  a second channel portion;
  a connecting portion disposed between the first channel portion and the second channel portion; and
  a plurality of electrode regions;
a first insulating layer disposed on the semiconductor layer;
a gate conductor disposed on the first insulating layer and including:
  a first gate electrode overlapping the first channel portion; and
  a second gate electrode overlapping the second channel portion;
a plurality of signal lines disposed on the substrate;
a first electrode electrically connected to at least one of the plurality of electrode regions of the semiconductor layer;
an emission layer disposed on the first electrode; and
a second electrode disposed on the emission layer, and
the first channel portion and the second channel portion of the semiconductor layer each have a first width in directions respectively perpendicular to main extension directions of the respective first and second channel portions, and
the first width is greater than a second width of the connecting portion extending directly from the respective first and second channel portions in a direction perpendicular to a main extension direction of the connecting portion being the same as the respective main extension directions of the respective first and second channel portions.

8. The display device of claim 7, wherein
the connecting portion overlaps one of the plurality of signal lines.

9. The display device of claim 8, wherein
the plurality of signal lines include an initialization voltage line, and
the connecting portion overlaps the initialization voltage line.

10. The display device of claim 9, wherein
the connecting portion further includes a first connecting portion extending in a first direction and two second connecting portions extending in a second direction which is different from the first direction and disposed on respective sides of the first connecting portion.

11. The display device of claim 10, wherein
the semiconductor layer further includes a first inclined portion disposed between the first channel portion and the connecting portion and a second inclined portion disposed between the second channel portion and the connecting portion, and
edges of the first inclined portion and the second inclined portion are inclined with a predetermined angle with respect to the first direction and the second direction.

12. The display device of claim 7, wherein
the plurality of signal lines include a data line, and
the connecting portion is disposed near the data line.

13. The display device of claim 7, wherein
the connecting portion further includes a first connecting portion extending in a first direction and a second connecting portion extending in a second direction which is different from the first direction.

14. The display device of claim 13, wherein
the semiconductor layer further includes a first inclined portion disposed between the first channel portion and the connecting portion and a second inclined portion disposed between the second channel portion and the connecting portion, and
edges of the first inclined portion and the second inclined portion are inclined with a predetermined angle with respect to the first direction and the second direction.

15. A display device comprising:
a substrate;
a plurality of signal lines including an initialization voltage line, a plurality of scan lines, a control line, a storage line, a data line, and a driving voltage line disposed on the substrate;
a first electrode;
an emission layer disposed on the first electrode;
a second electrode disposed on the emission layer; and
a plurality of transistors connected to the plurality of signal lines, and including:
  a first transistor connected to a first scan line from among the plurality of scan lines, the storage line, and the first electrode, and including:
    a semiconductor layer disposed on the substrate, and including:
      a first channel portion;
      a second channel portion;
      a connecting portion disposed between the first channel portion and the second channel portion, and
      a plurality of electrode regions;
    a first insulating layer disposed on the semiconductor layer; and a gate conductor disposed on the first insulating layer, and including a first gate electrode overlapping the first channel portion and a second gate electrode overlapping the second channel portion, wherein the first channel portion and the second channel portion of the semiconductor layer each have a first width in directions respectively perpendicular to main extension directions of the respective first and second channel portions, and the first width is greater than a second width of the connecting portion extending directly from the respective first and second channel portions in a direction perpendicular to a main extension direction of the connecting portion being the same as the respective main extension directions of the respective first and second channel portions.

16. The display device of claim 15, wherein the connecting portion further includes a first connecting portion extending in a first direction and a second connecting portion extending in a second direction which is different from the first direction, and a first inclined portion disposed between the first channel portion and the connecting portion, and a second inclined portion disposed between the second channel portion and the connecting portion, and edges of the first inclined portion and the second inclined portion are inclined with a predetermined angle with respect to the first direction and the second direction.

17. The display device of claim 15, wherein the plurality of transistors further includes a second transistor connected to a second scan line from among the plurality of scan lines, the initialization voltage line, and the storage line, the second transistor includes the semiconductor layer disposed on the substrate, and including a third channel portion, a fourth channel portion, a first connecting portion disposed between the third channel portion and the fourth channel portion, and the plurality of electrode regions, the first insulating layer is disposed on the semiconductor layer, the gate conductor is disposed on the first insulating layer and includes a third gate electrode overlapping the third channel portion and a fourth gate electrode overlapping the fourth channel portion, the third channel portion and the fourth channel portion of the semiconductor layer each have a third width in directions respectively perpendicular to main extension directions of the third and fourth channel portions, and the third width is greater than a fourth width of the first connecting portion in a direction perpendicular to a main extension direction of the first connecting portion.

18. The display device of claim 17, wherein the first connecting portion further includes a second connecting portion extending in a first direction, two third connecting portions extending in a second direction which is different from the first direction and disposed on respective sides of the second connecting portion, a third inclined portion disposed between the third channel portion and the third connecting portion, and a fourth inclined portion disposed between the fourth channel portion and the third connecting portion, and edges of the third inclined portion and the fourth inclined portion are inclined with a predetermined angle with respect to the first direction and the second direction.

19. The display device of claim 17, wherein the first connecting portion overlaps the initialization voltage line.

* * * * *